(12) United States Patent
Jo et al.

(10) Patent No.: US 11,818,931 B2
(45) Date of Patent: Nov. 14, 2023

(54) DISPLAY DEVICE

(71) Applicant: Samsung Display Co., Ltd., Yongin-si (KR)

(72) Inventors: Kang Moon Jo, Hwaseong-si (KR); Sung Jae Moon, Seongnam-si (KR); An Su Lee, Seoul (KR); Tak-Young Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/098,069

(22) Filed: Jan. 17, 2023

(65) Prior Publication Data

US 2023/0165092 A1 May 25, 2023

Related U.S. Application Data

(63) Continuation of application No. 17/160,284, filed on Jan. 27, 2021, now Pat. No. 11,563,077.

(30) Foreign Application Priority Data

May 14, 2020 (KR) .................. 10-2020-0057650

(51) Int. Cl.
*H10K 59/131* (2023.01)
*H10K 59/126* (2023.01)
(Continued)

(52) U.S. Cl.
CPC ....... *H10K 59/1315* (2023.02); *H10K 59/126* (2023.02); *H10K 59/1213* (2023.02);
(Continued)

(58) Field of Classification Search
CPC ........... H10K 59/1315; H10K 59/1213; H10K 59/1216
See application file for complete search history.

(56) References Cited

U.S. PATENT DOCUMENTS 7,518,307 B2 * 4/2009 Kim .................. H10K 59/179
313/506
9,443,886 B2 9/2016 Oh et al.
(Continued)

FOREIGN PATENT DOCUMENTS

KR 10-2016-0029487 3/2016
KR 10-2016-0091525 8/2016
(Continued)

OTHER PUBLICATIONS

Notice of Allowance dated Sep. 23, 2022, in U.S. Appl. No. 17/160,284.

*Primary Examiner* — Kevin M Nguyen
(74) *Attorney, Agent, or Firm* — H.C. Park & Associates, PLC

(57) ABSTRACT

A display device including: a substrate; first, second, and third data lines extending in a first direction on the substrate and disposed to be adjacent along a second direction crossing the first direction; a semiconductor layer disposed on the first, second, and third data lines; a first insulating layer disposed on the semiconductor layer; first, second, and third lower storage electrodes disposed on the first insulating layer and arranged to be adjacent along the first direction; a second insulating layer disposed on the first, second, and third lower storage electrodes; a first scan line extending in the second direction on the second insulating layer; a first pixel connected to the first scan line and the first data line; a second pixel connected to the first scan line and the second data line; and a third pixel connected to the first scan line and the third data line.

20 Claims, 21 Drawing Sheets

(51) Int. Cl.
*H10K 59/121* (2023.01)
*H01L 27/12* (2006.01)
*H10K 59/35* (2023.01)
*H10K 59/38* (2023.01)

(52) U.S. Cl.
CPC ...... *H10K 59/1216* (2023.02); *H01L 27/1214* (2013.01); *H10K 59/35* (2023.02); *H10K 59/38* (2023.02)

(56) References Cited

U.S. PATENT DOCUMENTS

| | | |
|---|---|---|
| 9,691,822 B2 | 6/2017 | Kim et al. |
| 10,192,935 B2 | 1/2019 | Shim et al. |
| 10,276,643 B2 | 4/2019 | Kim et al. |
| 10,297,194 B2 | 5/2019 | Kim |
| 2013/0140538 A1 | 6/2013 | Fujita et al. |
| 2017/0317155 A1 | 11/2017 | Oh et al. |
| 2019/0066614 A1 | 2/2019 | Tang et al. |
| 2019/0340966 A1* | 11/2019 | Lee .................. G09G 3/006 |
| 2020/0119115 A1 | 4/2020 | Moon et al. |

FOREIGN PATENT DOCUMENTS

| | | |
|---|---|---|
| KR | 10-2018-0024910 | 3/2018 |
| KR | 10-2018-0025520 | 3/2018 |
| KR | 10-1920769 | 11/2018 |
| KR | 10-2020-0040967 | 4/2020 |

* cited by examiner

DISPLAY DEVICE

CROSS-REFERENCE TO RELATED APPLICATION

This application is a Continuation of U.S. patent application Ser. No. 17/160,284, filed on Jan. 27, 2021, which claims priority from and the benefit of Korean Patent Application No. 10-2020-0057650, filed on May 14, 2020, which is hereby incorporated by reference for all purposes as if fully set forth herein.

BACKGROUND

Field

Exemplary embodiments of the invention relate generally to a display device.

Discussion of the Background

Display devices display images and among them, a light emitting diode display has been in the spotlight.

The light emitting diode display has a self-luminance characteristic and does not require a separate light source (i.e., backlight), unlike a liquid crystal display (LCD) device, and thus can have reduced thickness and weight. Further, the light emitting diode display represents high quality characteristics of low power consumption, high luminance, and a high reaction speed.

Generally, the light emitting diode display includes a plurality of pixels, and each pixel includes a plurality of transistors and a light-emitting element. The plurality of transistors are connected to scan lines and data lines, and may transmit a driving current to the light-emitting element. The data line typically overlaps with other wiring or an electrode to form a parasitic capacitor, which may delay signal transmission or cause crosstalk.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device with improved display quality by reducing a capacitance of a parasitic capacitor formed by overlapping wiring such as a scan line crossing a data line with the data line.

In addition, the present invention is to provide a display device capable of improving display quality by reducing the capacitance of the parasitic capacitor formed by overlapping a common electrode entirely disposed on a substrate with the data line.

Additional features of the inventive concepts will be set forth in the description which follows, and in part will be apparent from the description, or may be learned by practice of the inventive concepts.

A display device according to an exemplary embodiment includes: a substrate; first, second, and third data lines extending in a first direction on the substrate and disposed to be adjacent along a second direction crossing the first direction; a semiconductor layer disposed on the first, second, and third data lines; a first insulating layer disposed on the semiconductor layer; first, second, and third lower storage electrodes disposed on the first insulating layer and arranged to be adjacent along the first direction; a second insulating layer disposed on the first, second, and third lower storage electrodes; a first scan line extending in the second direction on the second insulating layer; a first pixel connected to the first scan line and the first data line; a second pixel connected to the first scan line and the second data line; and a third pixel connected to the first scan line and the third data line.

The display device according to an exemplary embodiment may further include a first auxiliary scan pattern overlapping the first scan line and connected to the first scan line, and the first auxiliary scan pattern may be disposed on the same layer as the first lower storage electrode and does not overlap the first, second, and third data lines.

The display device according to an exemplary embodiment may further include: a first upper storage electrode overlapping the first lower storage electrode; a second upper storage electrode overlapping the second lower storage electrode; and a third upper storage electrode overlapping the third lower storage electrode, and the first upper storage electrode, the second upper storage electrode, and the third upper storage electrode may be sequentially disposed along the first direction and disposed on the same layer as the first scan line.

The display device according to an exemplary embodiment may further include: a first light blocking layer overlapping the first lower storage electrode; a second light blocking layer overlapping the second lower storage electrode; and a third light blocking layer overlapping the third lower storage electrode, and the first light blocking layer, the second light blocking layer, and the third light blocking layer may be sequentially disposed along the first direction and disposed on the same layer on the first, second, and third data lines.

The display device according to an exemplary embodiment may further include a driving voltage line and an initialization voltage line extending in the first direction, the first pixel may include a first driving transistor connected between the driving voltage line and the first upper storage electrode, a first switching transistor connected between the first lower storage electrode and the first data line, and a first initialization transistor connected between the initialization voltage line and the first upper storage electrode, the second pixel includes a second driving transistor connected between the driving voltage line and the second upper storage electrode, a second switching transistor connected between the second lower storage electrode and the second data line, and a second initialization transistor connected between the initialization voltage line and the second upper storage electrode, and the third pixel includes a third driving transistor connected between the driving voltage line and the third upper storage electrode, a third switching transistor connected between the third lower storage electrode and the third data line, and a third initialization transistor connected between the initialization voltage line and the third upper storage electrode.

The first driving transistor, the second driving transistor, and the third driving transistor may be disposed sequentially along the first direction, the first switching transistor, the second switching transistor, and the third switching transistor may be sequentially disposed along the first direction and connected to the first scan line, and the first initialization transistor, the second initialization transistor, and the third initialization transistor may be sequentially disposed along the first direction.

The display device according to an exemplary embodiment may further include a second scan line extending in the second direction, and the second scan line may be disposed on the same layer as the first scan line and connected to the first initialization transistor, the second initialization transistor, and the third initialization transistor.

The display device according to an exemplary embodiment may further include a second auxiliary scan pattern overlapping the second scan line and connected to the second scan line, and the second auxiliary scan pattern may be disposed on the same layer as the first lower storage electrode and does not overlap the first, second, and third data lines.

The display device according to an exemplary embodiment may further include a third insulating layer disposed on the first scan line, the first pixel may further include a first pixel electrode disposed on the third insulating layer and connected to the first driving transistor, and the first pixel electrode may overlap the second pixel or the third pixel.

The display device according to an exemplary embodiment may further include: a common voltage line extending in the first direction and disposed on the same layer as the first data line; a common voltage connection pattern connected to the common voltage line and disposed on the same layer as the first pixel electrode; an emission layer disposed on the first pixel electrode; and a common electrode disposed on the emission layer and connected to the common voltage connection pattern.

The display device according to an exemplary embodiment may further include an auxiliary common voltage line extending in the second direction, disposed on the same layer as the first scan line, and connected to the common voltage line.

The display device according to an exemplary embodiment may further include an auxiliary driving voltage line extending in the second direction, disposed on the same layer as the first scan line, and connected to the driving voltage line.

The display device according to an exemplary embodiment may further include an auxiliary common voltage line extending from the common voltage connection pattern and disposed on the same layer as the first pixel electrode.

In the display device according to an exemplary embodiment, the second pixel may further include a second pixel electrode connected to the second driving transistor, the third pixel may further include a third pixel electrode connected to the third driving transistor, and the data line may overlap one of the first pixel electrode, the second pixel electrode, and the third pixel electrode and does not overlap the rest.

The display device according to an exemplary embodiment may further include a connection electrode connecting the first data line and the first switching transistor, and the connection electrode may be disposed on the same layer as the first scan line.

In the display device according to an exemplary embodiment, the second insulating layer may include a single opening overlapping the connection electrode, the first data line, and the first switching transistor, the connection electrode may be connected to the first data line and the first switching transistor through the opening, and the connection electrode may be in contact with the side surface of the first switching transistor in the opening.

A display device according to an exemplary embodiment includes: a substrate; a driving voltage line, a first data line, a second data line, and a third data line extending in a first direction on the substrate; a first scan line and a second scan line extending in a second direction crossing the first direction; and a first pixel, a second pixel, and a third pixel disposed between the driving voltage line and the first data line, disposed between the first scan line and the second scan line, and connected to the driving voltage line, the first scan line, and the second scan line, wherein the first pixel is connected to the first data line through at least one transistor, the second pixel is connected to the second data line through at least one transistor, and the third pixel is connected to the third data line through at least one transistor.

The display device according to an exemplary embodiment may further include an initialization voltage line extending in the first direction, and the first pixel includes a first driving transistor connected to the driving voltage line, a first switching transistor connected between the first data line and the first driving transistor, and a first initialization transistor between the initialization voltage line and the first driving transistor, the second pixel includes a second driving transistor connected to the driving voltage line, a second switching transistor connected between the second data line and the second driving transistor, and a second initialization transistor connected between the initialization voltage line and the second driving transistor, and the third pixel includes a third driving transistor connected to the driving voltage line, a third switching transistor connected between the third data line and the third driving transistor, and a third initialization transistor connected between the initialization voltage line and the third driving transistor.

The first driving transistor, the second driving transistor, and the third driving transistor may be sequentially disposed along the first direction, the first switching transistor, the second switching transistor, and the third switching transistor may be sequentially disposed along the first direction and connected to the first scan line, and the first initialization transistor, the second initialization transistor, and the third initialization transistor may be sequentially disposed along the first direction and connected to the second scan line.

The display device according to an exemplary embodiment may further include a buffer layer, a first insulating layer, and a second insulating layer disposed between the first data line and the first scan line.

The display device according to an exemplary embodiment may further include a common voltage line extending in the first direction, a first pixel electrode connected to the first driving transistor, an emission layer disposed on the first pixel electrode, and a common electrode disposed on the emission layer and connected to the common voltage line.

The display device according to an exemplary embodiment may further include a common voltage connection pattern connecting the common voltage line and the common electrode, and an auxiliary common voltage line extending in the second direction and connected to the common voltage line.

A display device according to an exemplary embodiment includes: a substrate; a common voltage line, a driving voltage line, and a data line extending in a first direction on the substrate and disposed on the same layer; a first common voltage auxiliary pattern overlapping the common voltage line; a first insulating layer disposed between the common voltage line and the first common voltage auxiliary pattern; a second common voltage auxiliary pattern overlapping the common voltage line and the first common voltage auxiliary pattern and connected to the common voltage line and the first common voltage auxiliary pattern; a second insulating layer disposed between the first common voltage auxiliary pattern and the second common voltage auxiliary pattern; a first scan line extending in a second direction crossing the first direction and disposed on the second insulating layer; a pixel connected to the driving voltage line, the data line, and the first scan line through at least one transistor; an auxiliary common voltage line extending in the second direction and connected to the common voltage line; a common voltage connection pattern connected to the common voltage line; a third insulating layer disposed between the second common voltage auxiliary pattern and the common voltage connection pattern; a common electrode connected to the second common voltage auxiliary pattern; and a fourth insulating layer disposed between the common voltage connection pattern and the common electrode.

The auxiliary common voltage line may be disposed on the same layer as the second common voltage auxiliary pattern and the first scan line.

The display device according to an exemplary embodiment may further include an auxiliary driving voltage line extending in the second direction, disposed on the same layer as the first scan line, and connected to the driving voltage line.

The auxiliary common voltage line may extend from the common voltage connection pattern and is disposed on the same layer as the common voltage connection pattern.

According to exemplary embodiments, it is possible to improve display quality by reducing the capacitance of the parasitic capacitor formed by overlapping the data line with the wiring such as a scan line that intersects the data line.

In addition, it is possible to improve the display quality by reducing the capacitance of the parasitic capacitor, which is formed by overlapping the common electrode entirely disposed on the substrate with the data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
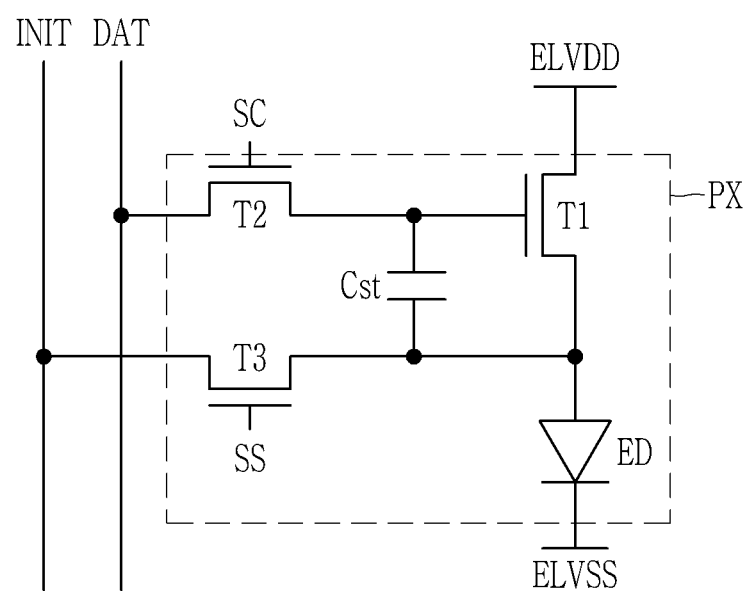
FIG. 1 is a circuit diagram of one pixel of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a circuit diagram of one pixel of a display device according to an exemplary embodiment.

The display device according to an exemplary embodiment includes a plurality of pixels PX. Each of the plurality of pixels PX may include, as shown in FIG. 1, a plurality of transistors T1, T2, and T3, a capacitor Cst, and at least one light emitting diode (LED) ED of a light-emitting element. In the present exemplary embodiment, an example in which one pixel PX includes one light emitting diode (LED) ED is mainly described.

The plurality of transistors T1, T2, and T3 include a driving transistor T1, a switching transistor T2, and an initialization transistor T3. The first electrode and the second electrode, which will be described below, are for distinguishing two electrodes positioned on both sides of the channels of each transistor T1, T2, and T3, and may be a source electrode or a drain electrode.

A gate electrode of the driving transistor T1 is connected to one terminal of the capacitor Cst, a first electrode of the driving transistor T1 is connected to a driving voltage line transmitting a driving voltage ELVDD, and a second electrode of the driving transistor T1 is connected to an anode of the light emitting diode (LED) ED and the other terminal of the capacitor Cst. The driving transistor T1 may receive a data voltage DAT depending on a switching operation of the switching transistor T2 to supply a driving current to the light emitting diode (LED) ED depending on the voltage stored in the capacitor Cst.

A gate electrode of the switching transistor T2 is connected to a first scan line transmitting a first scan signal SC, a first electrode of the switching transistor T2 is connected to a data line capable of transmitting a data voltage DAT or a reference voltage, and a second electrode of the switching transistor T2 is connected to one terminal of the capacitor Cst and the gate electrode of the driving transistor T1. The switching transistor T2 is turned on depending on the first scan signal SC, thereby transmitting the reference voltage or the data voltage DAT to the gate electrode of the driving transistor T1 and one terminal of the capacitor Cst.

A gate electrode of the initialization transistor T3 is connected to a second scan line transmitting a second scan signal SS, a first electrode of the initialization transistor T3 is connected to the other terminal of the capacitor Cst, the second electrode of the driving transistor T1, and the anode of the light emitting diode (LED) ED, and a second electrode of the initialization transistor T3 is connected to an initialization voltage line transmitting an initialization voltage INIT. The initialization transistor T3 is turned on depending on the second scan signal SS to transmit the initialization voltage INIT to the anode of the light emitting diode (LED) ED and the other terminal of the capacitor Cst, thereby initializing the voltage of the anode of the light emitting diode (LED) ED.

One terminal of the capacitor Cst is connected to the gate electrode of the driving transistor T1, and the other terminal is connected to the first electrode of the initialization transistor T3 and the anode of the light emitting diode (LED) ED. The cathode of the light emitting diode (LED) ED is connected to a common voltage line transmitting a common voltage ELVSS.

The light emitting diode (LED) ED may emit light of luminance according to the driving current generated by the driving transistor T1.

An example of the operation of the circuit diagram shown in FIG. 1, particularly one example of the operation during one frame, will be described. Here, a case that the transistors T1, T2, and T3 are N-type channel transistors is described as an example, but is not limited thereto.

When one frame starts, the first scan signal SC of a high level and the second scan signal SS of a high level are supplied in the initialization period, so that the switching transistor T2 and the initialization transistor T3 are turned on. Through the turned-on switching transistor T2, the reference voltage from the data line is supplied to the gate electrode of the driving transistor T1 and one terminal of the capacitor Cst, and the initialization voltage INIT is supplied to the second electrode of the driving transistor T1 and the anode of the light emitting diode (LED) ED through the turned-on initialization transistor T3

Accordingly, during the initialization period, the anode of the light emitting diode (LED) ED and the second electrode of the driving transistor T1 are initialized to the initialization voltage INIT. The difference voltage between the reference voltage and the initialization voltage INIT is stored in the capacitor Cst.

Next, when the second scan signal SS becomes a low level in a state that the first scan signal SC of high level is maintained in a sensing period, the switching transistor T2 remains in the turned-on state and the initialization transistor T3 is turned off. The gate electrode of the driving transistor T1 and one terminal of the capacitor Cst maintain the reference voltage through the turned-on switching transistor T2, and the second electrode of the driving transistor T1 and the anode of the light emitting diode (LED) ED are disconnected from the initialization voltage INIT through the turned-off initialization transistor T3. Accordingly, if the current flows from the first electrode to the second electrode and the voltage of the second electrode becomes "reference voltage-Vth", the driving transistor T1 is turned off. Vth represents a threshold voltage of the driving transistor T1. At this time, the voltage difference between the gate electrode and the second electrode of the driving transistor T1 is stored in the capacitor Cst, and the sensing of the threshold voltage Vth of the driving transistor T1 is completed. By generating the compensated data signal by reflecting the characteristic information sensed during the sensing period, the characteristic deviation of the driving transistor T1, which may be different for each pixel, may be externally compensated.

Next, in a data input period, when the first scan signal SC of a high level is supplied and the second scan signal SS of a low level is supplied, the switching transistor T2 is turned on and the initialization transistor T3 is turned off. Through the turned-on switching transistor T2, the data voltage DAT from the data line is supplied to the gate electrode of the driving transistor T1 and one terminal of the capacitor Cst. At this time, the second electrode of the driving transistor T1 and the anode of the light emitting diode (LED) ED may almost maintain the potential in the sensing period as it is by the driving transistor T1 in the turn-off state.

Next, the driving transistor T1 turned on by the data voltage DAT transferred to the gate electrode during the light emission period generates the driving current according to the data voltage DAT, and the light emitting diode (LED) ED may emit light by the driving current.

Next, the detailed structure of the display device according to an exemplary embodiment is described with reference to FIG. 2 to FIG. 9 along with FIG. 1.

Figure 2:
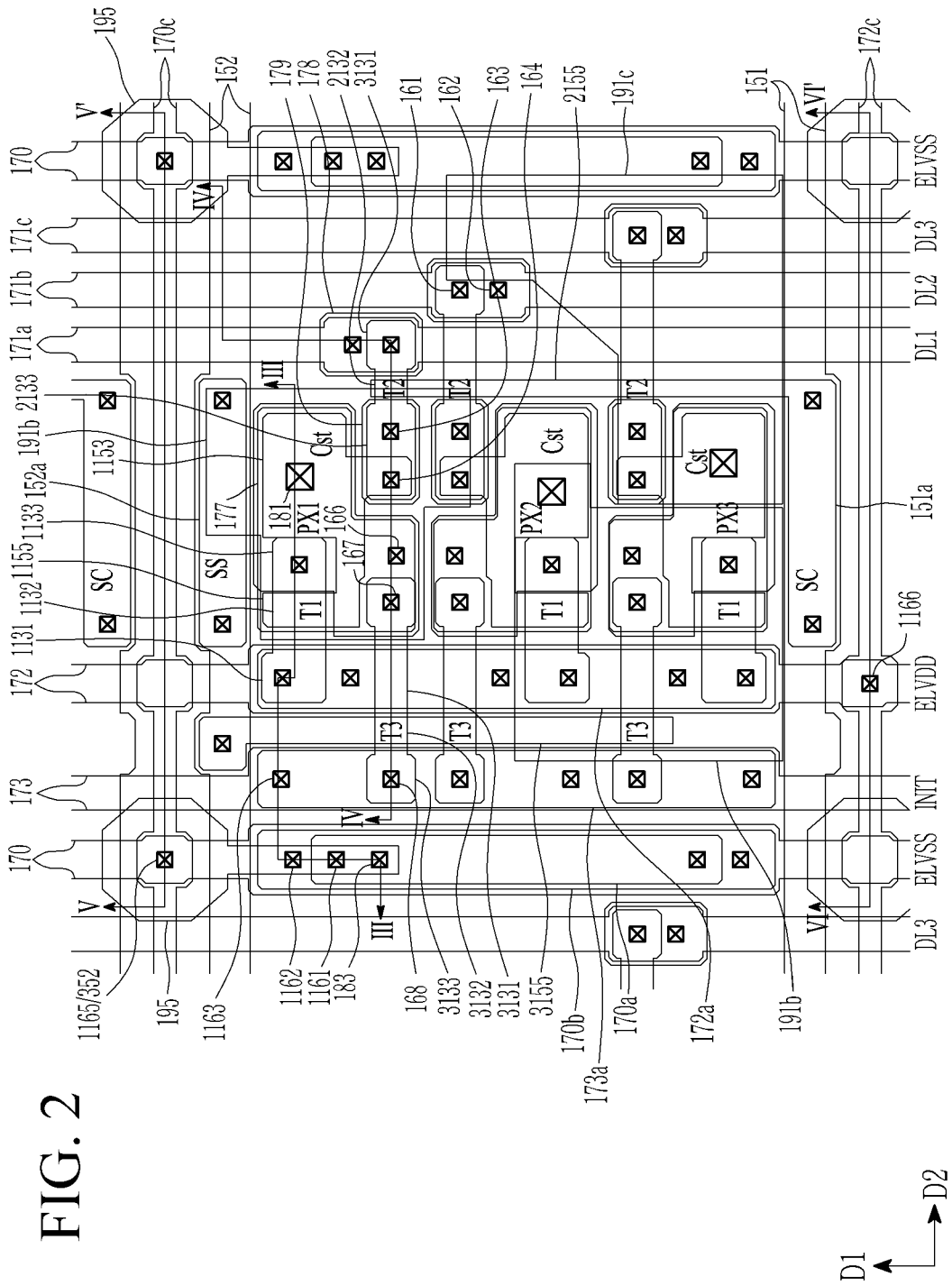
FIG. 2 is a top plan view showing a part of a display device according to an exemplary embodiment.
Figure 3:
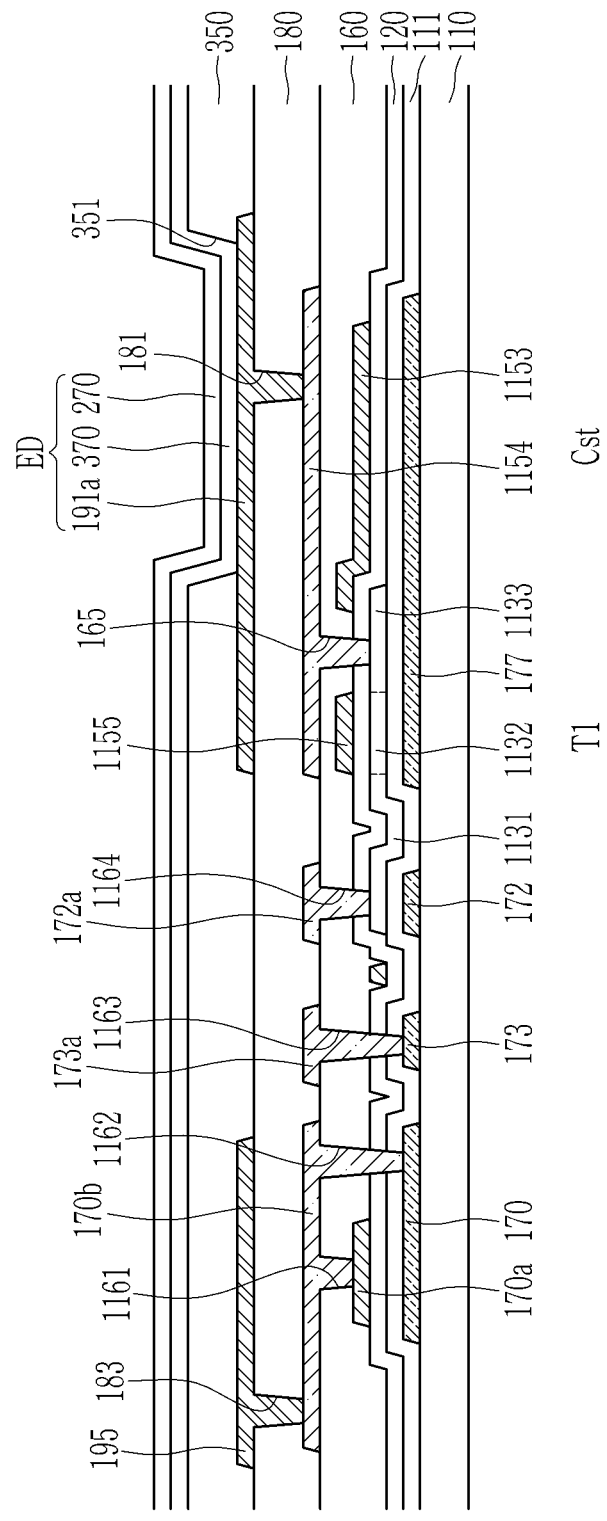
FIG. 3 is a cross-sectional view of a display device according to an exemplary embodiment taken along a line III-III' of FIG. 2.
Figure 4:
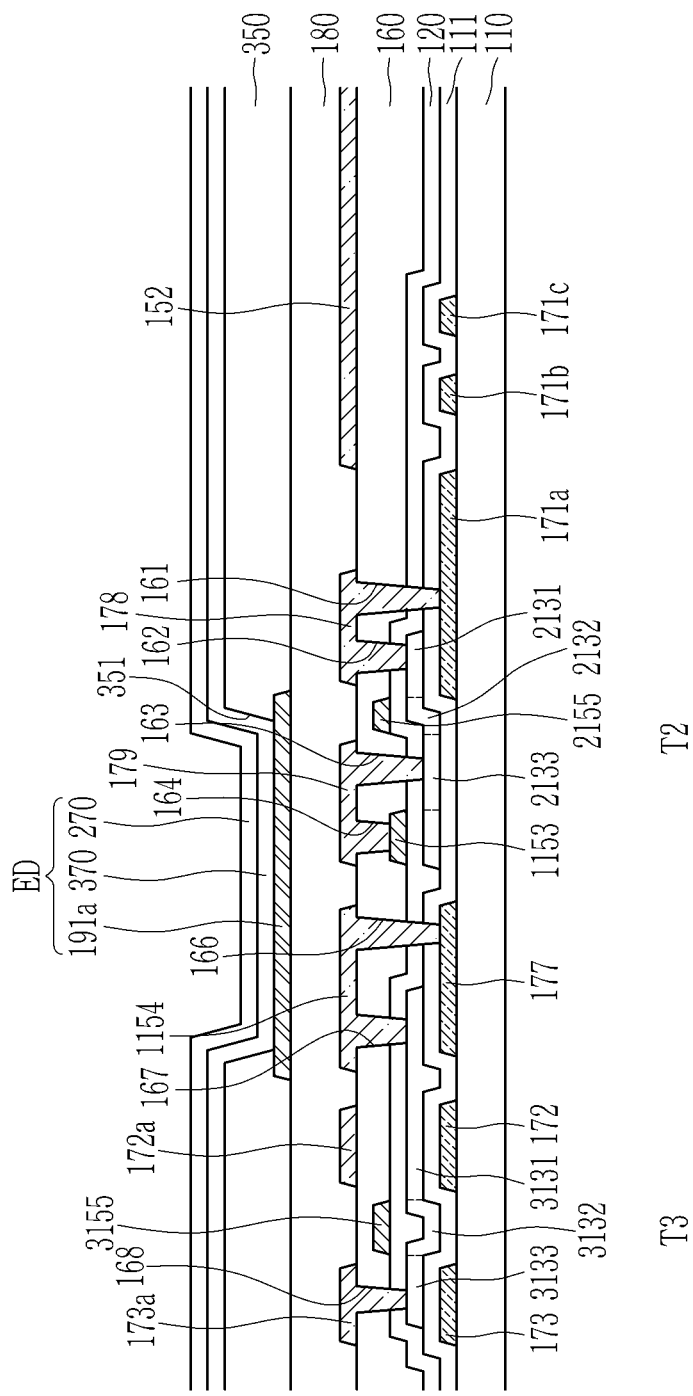
FIG. 4 is a cross-sectional view of a display device according to an exemplary embodiment taken along a line IV-IV' of FIG. 2.
Figure 5:
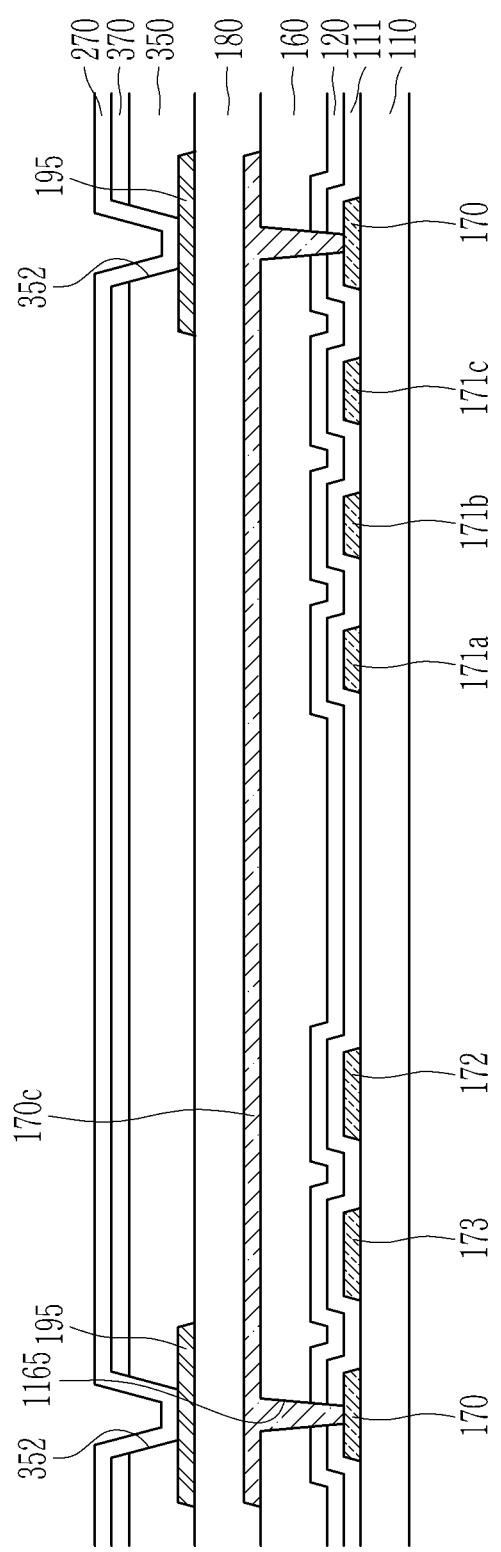
FIG. 5 is a cross-sectional view of a display device according to an exemplary embodiment taken along a line V-V' of FIG. 2.
Figure 6:
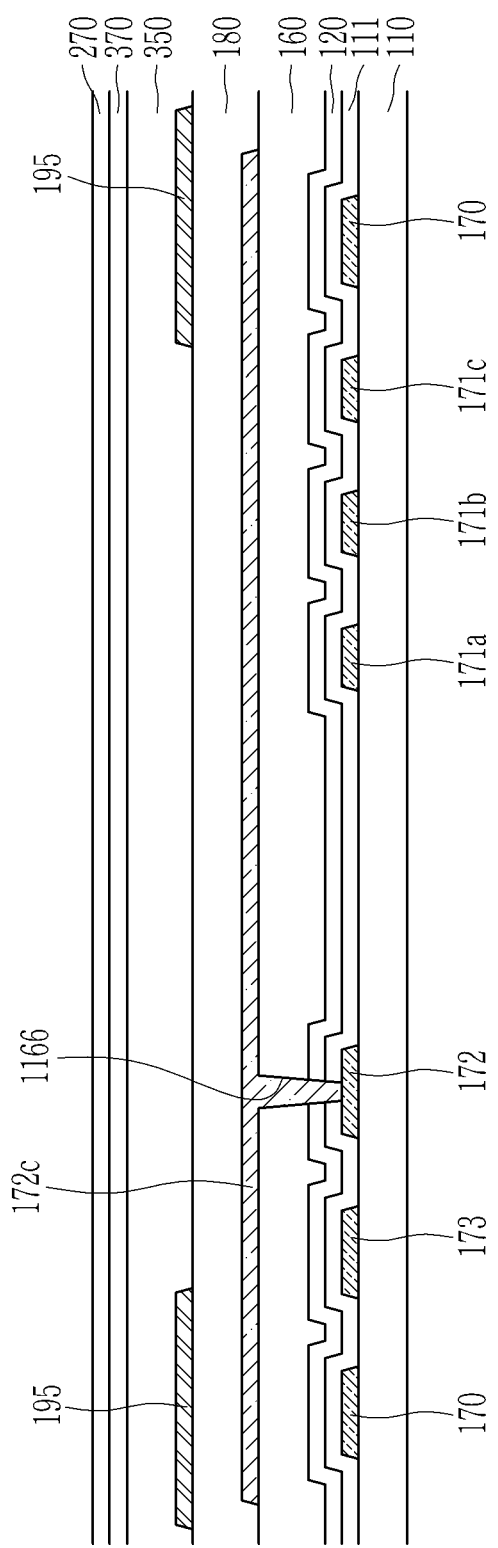
FIG. 6 is a cross-sectional view of a display device according to an exemplary embodiment taken along a line VI-VI' of FIG. 2.

FIG. 2 is a top plan view showing a part of a display device according to an exemplary embodiment, FIG. 3 is a cross-sectional view of a display device according to an exemplary embodiment taken along a line III-III' of FIG. 2, and FIG. 4 is a cross-sectional view of a display device according to an exemplary embodiment taken along a line IV-IV' of FIG. 2. FIG. 5 is a cross-sectional view of a display device according to an exemplary embodiment taken along a line V-V' of FIG. 2, and FIG. 6 is a cross-sectional view of a display device according to an exemplary embodiment taken along a line VI-VI' of FIG. 2. FIG. 7 to FIG. 10 are top plan views sequentially shown according to a manufacturing sequence of a display device according to an exemplary embodiment. FIG. 2 to FIG. 10 show three adjacent pixels of the display device according to an exemplary embodiment, and these pixels may be repeatedly disposed.

Here, each of a plurality of pixels PX1, PX2, and PX3 may mean a portion or a region where the constituent element included in one pixel PX described above, that is, a plurality of transistors T1, T2, and T3, the capacitor Cst, and the light emitting diode (LED) are formed.

The display device according to an exemplary embodiment may include a substrate 110. The substrate 110 may include an insulating material such as glass and plastic, and may have flexibility.

Figure 7:
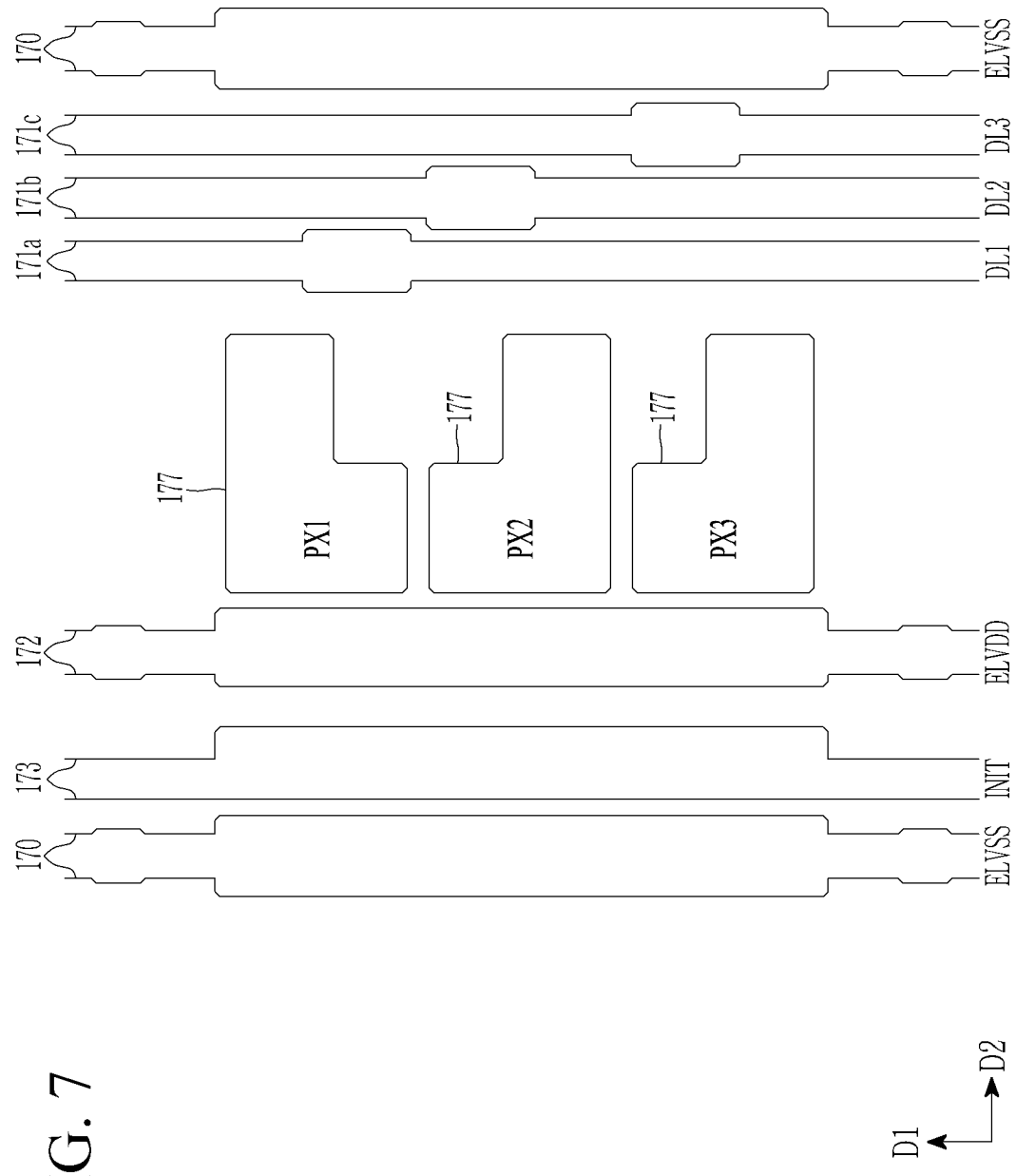
FIG. 7, FIG. 8, FIG. 9, and FIG. 10 are top plan views sequentially shown according to a manufacturing sequence of a display device according to an exemplary embodiment.

On the substrate 110, a first conductive layer including a first data line 171a, a second data line 171b, and a third data line 171c may be disposed. FIG. 7 shows the first conductive layer.

The first data line 171a, the second data line 171b, and the third data line 171c extend in a first direction D1. That is, the first data line 171a, the second data line 171b, and the third data line 171c may be formed of a rod shape having a predetermined width and extending along the first direction D1. The first data line 171a, the second data line 171b, and the third data line 171c may be disposed to be adjacent along a second direction D2 crossing the first direction D1. The first data line 171a, the second data line 171b, and the third data line 171c may be disposed to be spaced apart by a predetermined interval. Different data voltages DL1, DL2, and DL3 are applied to the first data line 171a, the second data line 171b, and the third data line 171c, and they may be disposed apart to prevent shorts between them. The first direction D1 may be a column direction, and the second direction D2 may be a row direction. The first direction D1 and the second direction D2 may be perpendicular to each other. The second data line 171*b* may be disposed adjacent and to the right of the first data line 171*a*, and the third data line 171*c* may be disposed adjacent and to the right of the second data line 171*b*. The expression that the data lines 171*a*, 171*b*, and 171*c* are adjacently disposed means that no other wiring extending in the direction parallel to the data lines 171*a*, 171*b*, and 171*c* between the data lines 171*a*, 171*b*, and 171*c* is disposed. That is, other wiring extending in a direction parallel to them is not disposed between the first data line 171*a* and the second data line 171*b* adjacent to each other. Also, other wiring is not disposed between the second data line 171*b* and the third data line 171*c* adjacent to each other.

The first conductive layer may further include a common voltage line 170, an initialization voltage line 173, a driving voltage line 172, and a light blocking pattern 177.

The common voltage line 170, the initialization voltage line 173, and the driving voltage line 172 extend in the first direction D1. That is, the common voltage line 170, the initialization voltage line 173, and the driving voltage line 172 may extend in a direction parallel to the first to third data lines 171*a*, 171*b*, and 171*c*. The common voltage line 170, the initialization voltage line 173, and the driving voltage line 172 may be disposed to be adjacent along the second direction D2. The common voltage line 170, the initialization voltage line 173, and the driving voltage line 172 may be disposed to be spaced apart with a predetermined interval. The common voltage ELVSS may be applied to the common voltage line 170, the initialization voltage INIT may be applied to the initialization voltage line 173, and the driving voltage ELVDD may be applied to the driving voltage line 172. It may be disposed spaced apart so that no short occurs between common voltage line 170, the initialization voltage line 173, and the driving voltage line 172 to which different voltages are applied. The initialization voltage line 173 may be disposed between the common voltage line 170 and the driving voltage line 172. However, their position is not limited to this and may be changed.

The light blocking pattern 177 may be disposed between the driving voltage line 172 and the first data line 171*a* on a plane. Each of the first to third pixels PX1, PX2, and PX3 may include the light blocking pattern 177, and a plurality of light blocking patterns 177 may be disposed to be adjacent to each other along the first direction D1. The light blocking pattern 177 of the second pixel PX2 may be disposed below the light blocking pattern 177 of the first pixel PX1 on a plane, and the light blocking pattern 177 of the third pixel PX3 may be disposed below the light blocking pattern 177 of the second pixel PX2.

The plane shape of the light blocking pattern 177 may be made of polygons. The plane shape of the light blocking pattern 177 of a plurality of pixels PX1, PX2, and PX3 may be the same or different. For example, the plane shapes of the light blocking patterns 177 of the first pixel PX1 and the second pixel PX2 may be symmetrical to each other, and the plane shapes of the light blocking patterns 177 of the second pixel PX2 and the third pixel PX3 may be the same.

An insulating layer of a buffer layer 111 may be disposed on the first conductive layer including the first data line 171*a*, the second data line 171*b*, the third data line 171*c*, the common voltage line 170, the initialization voltage line 173, the driving voltage line 172, and the light blocking pattern 177.

Figure 8:
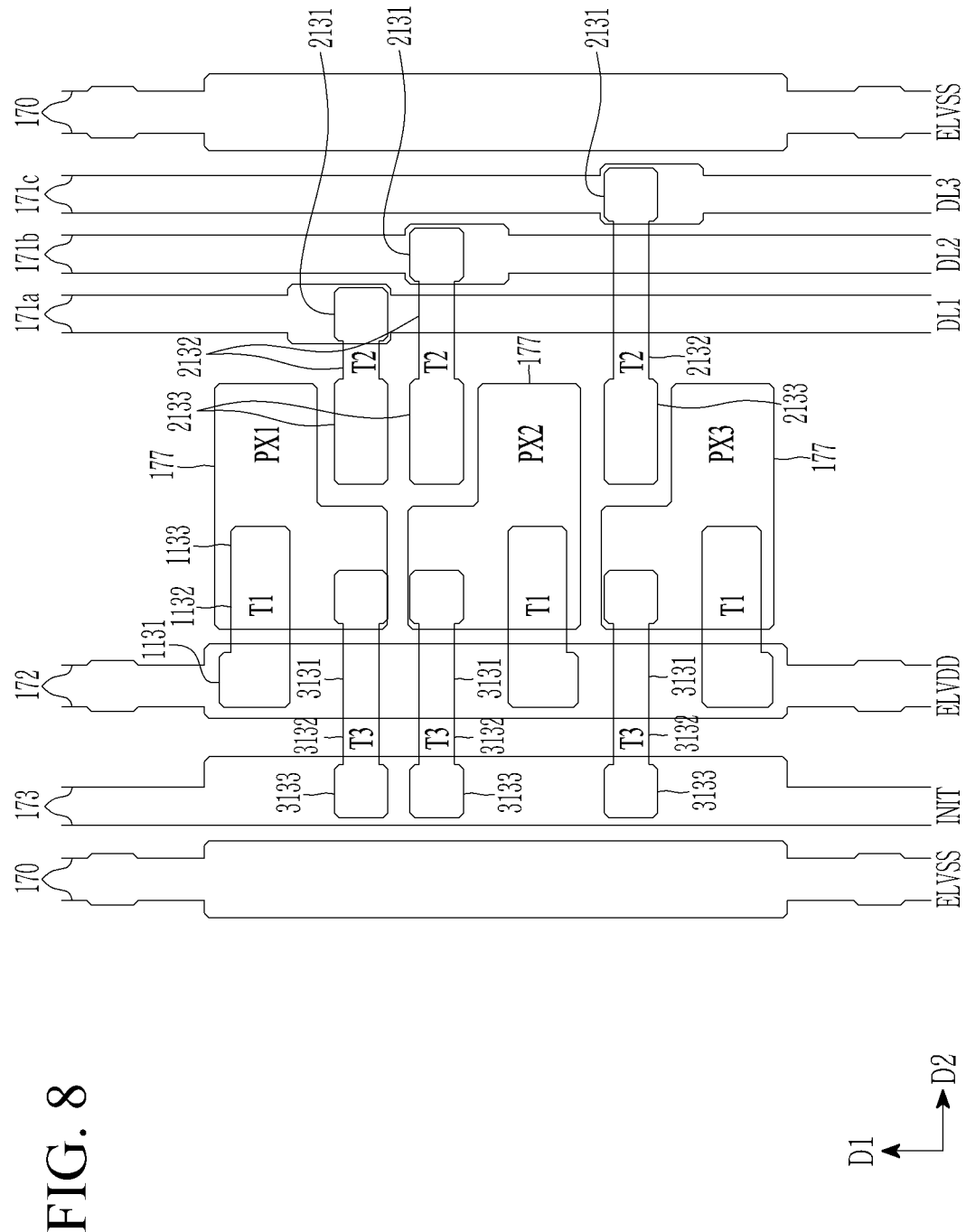

On the buffer layer 111, a semiconductor layer including a channel 1132 of the driving transistor T1 of the first to third pixels PX1, PX2, and PX3, a first electrode 1131, and a second electrode 1133, a channel 2132 of the switching transistor T2, a first electrode 2131, and a second electrode 2133, and a channel 3132 of the initialization transistor T3, and a first electrode 3131 and a second electrode 3133, may be disposed. FIG. 8 shows the first conductive layer and the semiconductor layer. The semiconductor layer may include a semiconductor material such as amorphous silicon, polysilicon, or an oxide semiconductor.

The channel 1132, the first electrode 1131, and the second electrode 1133 of the driving transistor T1 may be formed in a rod shape extending in the second direction D2. The channel 1132 of the driving transistor T1 may be disposed between the first electrode 1131 and the second electrode 1133. The first electrode 1131 of the driving transistor T1 may overlap the driving voltage line 172. The first electrode 1131 of the driving transistor T1 may be connected to the driving voltage line 172 and may receive the driving voltage ELVDD from the driving voltage line 172. However, the first electrode 1131 of the driving transistor T1 may not be directly connected to the driving voltage line 172. The channel 1132 and the second electrode 1133 of the driving transistor T1 may overlap the light blocking pattern 177.

The driving transistors T1 of the first to third pixels PX1, PX2, and PX3 may be sequentially disposed along the first direction D1. That is, the driving transistor T1 of the second pixel PX2 may be disposed below the driving transistor T1 of the first pixel PX1 on a plane, and the driving transistor T1 of the third pixel PX3 may be disposed below the driving transistor T1 of the second pixel PX2.

The channel 2132, the first electrode 2131, and the second electrode 2133 of the switching transistor T2 may be formed in a rod shape extending in the second direction D2. The channel 2132 of the switching transistor T2 may be disposed between the first electrode 2131 and the second electrode 2133. The first electrode 2131 of the switching transistor T2 may overlap the data lines 171*a*, 171*b*, and 171*c* and may be connected to the data lines 171*a*, 171*b*, and 171*c*. The first electrode 2131 of the switching transistor T2 of the first pixel PX1 may be connected to the first data line 171*a*. The first electrode 2131 of the switching transistor T2 of the second pixel PX2 may be connected to the second data line 171*b*. The first electrode 2131 of the switching transistor T2 of the third pixel PX3 may be connected to the third data line 171*b*. However, the first electrode 2131 of the switching transistor T2 of the first to third pixels PX1, PX2, and PX3 may not be directly connected to each data line 171*a*, 171*b*, and 171*c*. The length of the first electrode 2131 of the switching transistor T2 of the first to third pixels PX1, PX2, and PX3 may be different. For example, the length of the first electrode 2131 of the switching transistor T2 of the second pixel PX2 may be longer than the length of the first electrode 2131 of the switching transistor T2 of the first pixel PX1. The first electrode 2131 of the switching transistor T2 of the second pixel PX2 may be longer than the first electrode 2131 of the switching transistor T2 of the second pixel PX2.

The switching transistors T2 of the first to third pixels PX1, PX2, and PX3 may be sequentially disposed along the first direction D1. That is, the switching transistor T2 of the second pixel PX2 may be disposed below the switching transistor T2 of the first pixel PX1 on a plane, and the switching transistor T2 of the third pixel PX3 may be disposed below the switching transistor T2 of the second pixel PX2. The switching transistors T2 of the first to third pixels PX1, PX2, and PX3 are connected to the different data lines 171*a*, 171*b*, and 171*c*.

The channel 3132, the first electrode 3131, and the second electrode 3133 of the initialization transistor T3 may be formed in a rod shape extended in the second direction D2. The channel 3132 of the initialization transistor T3 may be disposed between the first electrode 3131 and the second electrode 3133. The second electrode 3133 of the initialization transistor T3 may overlap the initialization voltage line 173. The second electrode 3133 of the initialization transistor T3 may be connected to the initialization voltage line 173 and receive the initialization voltage INIT. However, the second electrode 3133 of the initialization transistor T3 may not be directly connected to the initialization voltage line 173. The first electrode 3131 of the initialization transistor T3 may overlap the driving voltage line 172 and the light blocking pattern 177.

The initialization transistors T3 of the first to third pixels PX1, PX2, and PX3 may be disposed sequentially along the first direction D1. That is, the initialization transistor T3 of the second pixel PX2 may be disposed below the initialization transistor T3 of the first pixel PX1 on a plane, and the initialization transistor T3 of the third pixel PX3 may be disposed below the initialization transistor T3 of the second pixel PX2.

A first insulating layer 120 may be disposed on the semiconductor layer including the channel 1132, the first electrode 1131, and the second electrode 1133 of the driving transistor T1, the channel 2132, the first electrode 2131, and the second electrode 2133 of the switching transistor T2, and the channel 3132, the first electrode 3131, and the second electrode 3133 of the initialization transistor T3.

Figure 9:
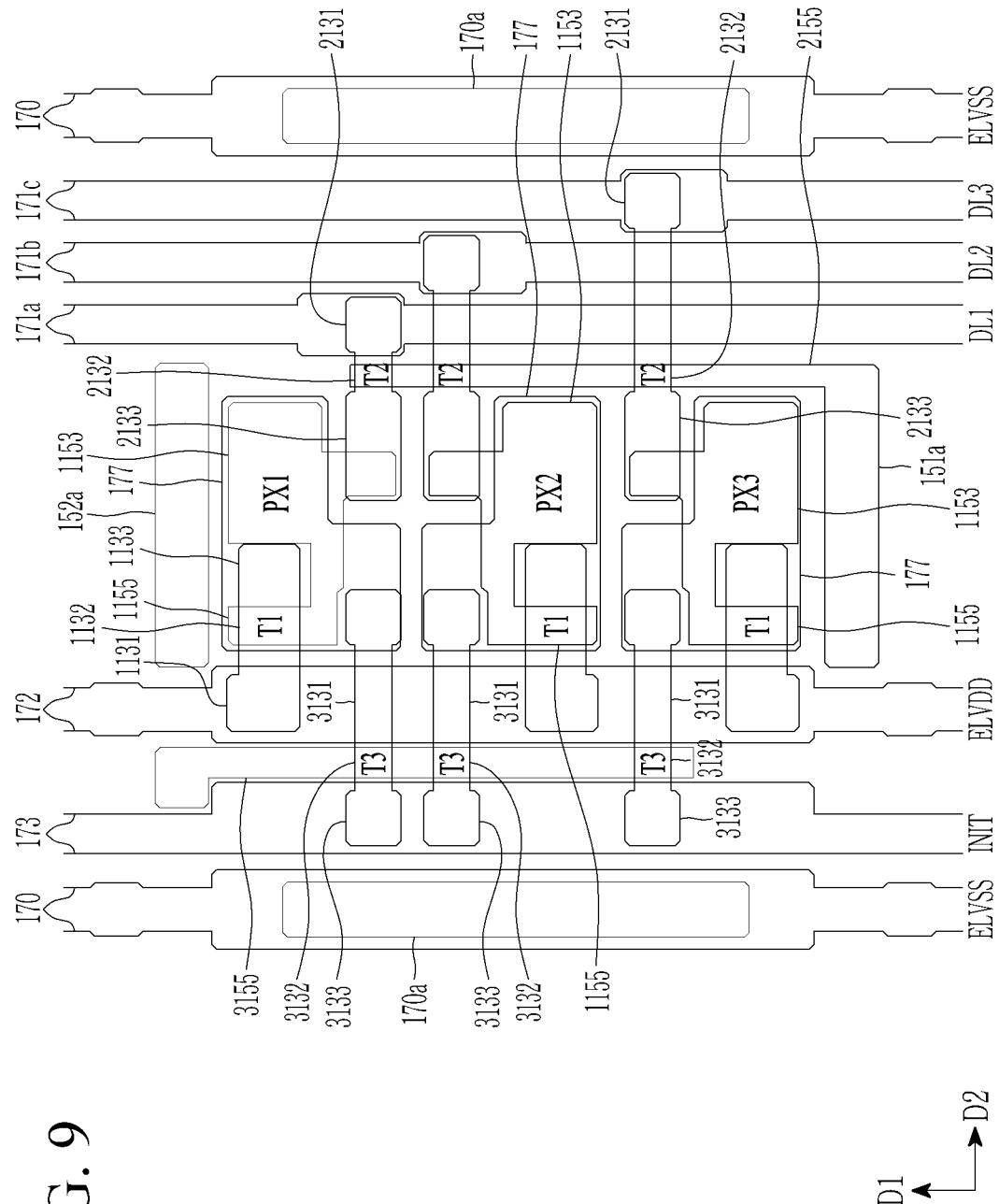

On the first insulating layer 120, a second conductive layer including a gate electrode 1155 of the driving transistor T1 of the first to third pixels PX1, PX2, and PX3, a gate electrode 2155 of the switching transistor T2, a gate electrode 3155 of the initialization transistor T3, and a lower storage electrode 1153 may be disposed. FIG. 9 shows the first conductive layer, the semiconductor layer, and the second conductive layer.

The gate electrode 1155 of the driving transistor T1 may overlap the channel 1132 of the driving transistor T1. The gate electrode 1155 of the driving transistor T1 may be connected to the lower storage electrode 1153, and may be integrally formed. The lower storage electrode 1153 may overlap the second electrode 2133 of the switching transistor T2. The lower storage electrode 1153 may be connected to the second electrode 2133 of the switching transistor T2. However, the lower storage electrode 1153 may not be directly connected to the second electrode 2133 of the switching transistor T2.

The planar shape of the lower storage electrode 1153 may consist of polygons. The plane shape of the lower storage electrode 1153 of the first to third pixels PX1, PX2, and PX3 may be the same or different. For example, the plane shape of the lower storage electrode 1153 of the first pixel PX1 and the second pixel PX2 may be symmetrical to each other, and the plane shape of the lower storage electrode 1153 of the second pixel PX2 and the third pixel PX3 may be the same.

The gate electrode 2155 of the switching transistor T2 may overlap the channel 2132 of the switching transistor T2. The gate electrodes 2155 of the switching transistors T2 of the first to third pixels PX1, PX2, and PX3 may be connected to each other and may be integrally formed. Therefore, the same first scan signal SC may be applied to the gate electrodes 2155 of the switching transistors T2 of the first to third pixels PX1, PX2, and PX3. The gate electrodes 2155 of the switching transistor T2 connected to each other may be formed in a rod shape extending in the first direction D1.

The gate electrode 3155 of initialization transistor T3 may overlap the channel 3132 of the initialization transistor T3.

The gate electrodes 3155 of the initialization transistors T3 of the first to third pixels PX1, PX2, and PX3 may be connected to each other and may be integrally formed. Therefore, the same second scan signal SS may be applied to the gate electrodes 3155 of the initialization transistors T3 of the first to third pixels PX1, PX2, and PX3. The gate electrodes 3155 of the initialization transistors T3 connected to each other may be formed in a rod shape extending in the first direction D1.

After forming the second conductive layer, a doping process may be performed. The semiconductor layer covered by the second conductive layer is not doped, and the portion of the semiconductor layer not covered by the second conductive layer is doped to have the same characteristic as the conductor. That is, the channel 1132 of the driving transistor T1, the channel 2132 of the switching transistor T2, and the channel 3132 of the initialization transistor T3 that are covered by the second conductive layer are not doped. The first electrode 1131 and the second electrode 1133 of the driving transistor T1, the first electrode 2131 and the second electrode 2133 of the switching transistor T2, and the first electrode 3131 and the second electrode 3133 of the initialization transistor T3, which are not covered by the second conductive layer, are doped to have the same characteristic as the conductor.

The second conductive layer may further include a first auxiliary scan pattern 151a, a second auxiliary scan pattern 152a, a first common voltage auxiliary pattern 170a.

The first auxiliary scan pattern 151a and the second auxiliary scan pattern 152a may extend in the second direction D2. The lower storage electrode 1153 of the first to third pixels PX1, PX2, and PX3 may be disposed between the first auxiliary scan pattern 151a and the second auxiliary scan pattern 152a on a plane. The first auxiliary scan pattern 151a may be connected to the gate electrode 2155 of the switching transistor T2 and may be integrally formed.

The first common voltage auxiliary pattern 170a may overlap the common voltage line 170. The first common voltage auxiliary pattern 170a may be formed as a rod shape extending in the first direction D1. The common voltage line 170 may have a shape extending from one end of the substrate 110 to the other end on a plane. The first common voltage auxiliary pattern 170a may be repeatedly disposed in a disconnected shape for every three pixels PX1, PX2, and PX3. The first common voltage auxiliary pattern 170a may be connected to the common voltage line 170 and may serve to lower the resistance of the common voltage line 170. The first common voltage auxiliary pattern 170a may not be directly connected to the common voltage line 170.

A second insulating layer 160 may be disposed on the second conductive layer including the gate electrode 1155 of the driving transistor T1, the gate electrode 2155 of the switching transistor T2, the gate electrode 3155 of the initialization transistor T3, and the lower storage electrode 1153.

Figure 10:
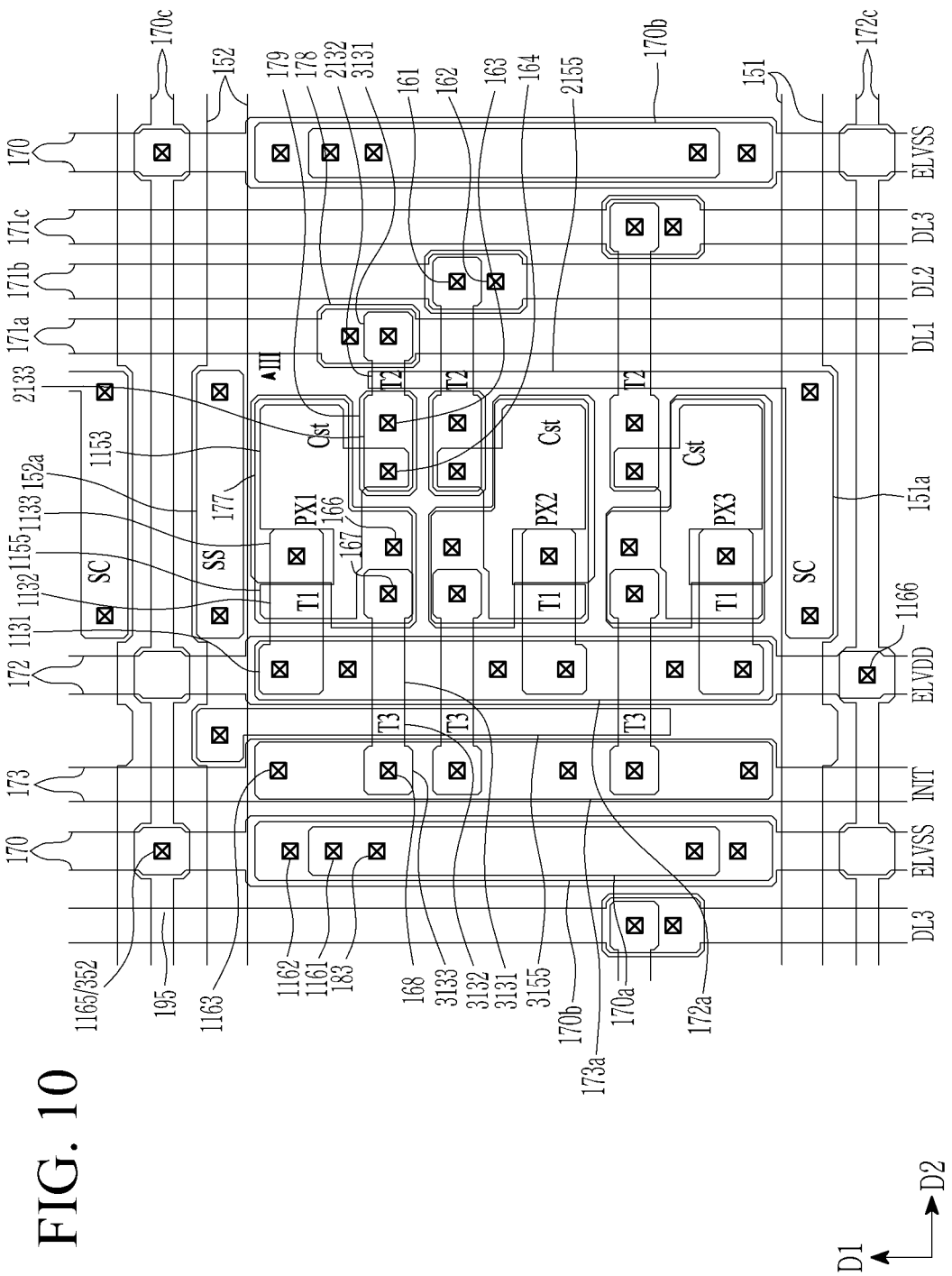

On the second insulating layer 160, a third conductive layer including a first scan line 151, a second scan line 152, and an upper storage electrode 1154 may be disposed. FIG. 10 shows the first conductive layer, the semiconductor layer, the second conductive layer, and the third conductive layer.

The first scan line 151 extends in the second direction D2. The first scan line 151 may intersect the data lines 171a, 171b, and 171c, and the first scan line 151 and the data lines 171a, 171b, and 171c may overlap at their intersections. The first scan line 151 may overlap the first auxiliary scan pattern 151a. The first scan line 151 may be connected to the first auxiliary scan pattern 151a. The first auxiliary scan pattern 151a may serve to lower the resistance of the first scan line 151. The first auxiliary scan pattern 151a may not overlap data lines 171a, 171b, and 171c. The first scan line 151 may have a shape extending from one end of the substrate 110 to the other end. The first auxiliary scan pattern 151a may be repeatedly disposed in a disconnected shape with a length corresponding to a region between the driving voltage line 172 and the first data line 171a. The first scan signal SC may be applied to the first scan line 151. The first scan line 151 may be connected to the gate electrode 2155 of the switching transistor T2 through the first auxiliary scan pattern 151a. Therefore, the gate electrode 2155 of the switching transistor T2 may receive the first scan signal SC from the first scan line 151.

A parasitic capacitor may be formed at a portion where each data line 171a, 171b, and 171c overlaps with the first scan line 151. In the present exemplary embodiment, the data lines 171a, 171b, and 171c are disposed on the first conductive layer, and the first scan line 151 is disposed on the third conductive layer. Accordingly, the first insulating layer 120 and the second insulating layer 160 may be disposed between the data lines 171a, 171b, and 171c and the first scan line 151. In comparison, when the first scan line 151 is disposed on the second conductive layer and the data lines 171a, 171b, and 171c are disposed on the third conductive layer, the second insulating layer 160 is between the first scan line 151 and the data lines 171a, 171b, and 171c. In the present exemplary embodiment, the distance between the data lines 171a, 171b, and 171c and the first scan line 151 is relatively long compared to the case where the first scan line 151 is disposed on the second conductive layer and the data lines 171a, 171b, and 171c are disposed on the third conductive layer, so the capacitance of the parasitic capacitor may be reduced. In addition, since the first auxiliary scan pattern 151a does not overlap with the data lines 171a, 171b, and 171c, the capacitance of the parasitic capacitor may be reduced.

The second scan line 152 is extended in the second direction D2. The second scan line 152 may intersect the data lines 171a, 171b, and 171c, and the second scan line 152 and the data lines 171a, 171b, and 171c may overlap at their intersections. The second scan line 152 may overlap the second auxiliary scan pattern 152a. The second scan line 152 may be connected to the second auxiliary scan pattern 152a. The second auxiliary scan pattern 152a may serve to lower the resistance of the second scan line 152. The second auxiliary scan pattern 152a may not overlap the data lines 171a, 171b, and 171c. The second scan line 152 may have a shape extending from one end of the substrate 110 to the other end. The second auxiliary scan pattern 152a has a length corresponding to a region between the driving voltage line 172 and the first data line 171a, and may be repeatedly disposed in a disconnected shape. The second scan signal SS may be applied to the second scan line 152. The second scan line 152 may be connected to the gate electrode 3155 of the initialization transistor T3. Therefore, the gate electrode 3155 of the initialization transistor T3 may receive the second scan signal SS from the second scan line 152.

A parasitic capacitor may be formed at a portion where each data line 171a, 171b, and 171c overlaps the second scan line 152. In the present exemplary embodiment, the data lines 171a, 171b, and 171c are disposed on the first conductive layer, and the second scan line 152 is disposed on the third conductive layer. Accordingly, the first insulating layer 120 and the second insulating layer 160 may be disposed between the data lines 171a, 171b, and 171c and the second scan line 152. Accordingly, compared with the case that the second scan line 152 is disposed on the second conductive layer and the data lines 171a, 171b, and 171c are disposed on the third conductive layer, the capacitance of the parasitic capacitor between the data lines 171a, 171b, and 171c and the second scan line 152 may be reduced. In addition, since the second auxiliary scan pattern 152a does not overlap the data lines 171a, 171b, and 171c, the capacitance of the parasitic capacitor may be reduced.

The upper storage electrode 1154 may overlap the lower storage electrode 1153. The lower storage electrode 1153 and the upper storage electrode 1154 may overlap each other via the second insulating layer 160 therebetween to form the capacitor Cst. The lower storage electrode 1153 may overlap the light blocking pattern 177 with the first insulating layer 120 therebetween, so that capacitor Cst may be formed in duplicate.

The upper storage electrode 1154 may overlap the second electrode 1133 of the driving transistor T1. The second insulating layer 160 may include an opening 165 overlapping the upper storage electrode 1154 and the second electrode 1133 of the driving transistor T1. The opening 165 may be further formed in the first insulating layer 120. The upper storage electrode 1154 may be connected to the second electrode 1133 of the driving transistor T1 through the opening 165.

The upper storage electrode 1154 may overlap the light blocking pattern 177. The second insulating layer 160 may include an opening 166 overlapping the upper storage electrode 1154 and the light blocking pattern 177. The opening 166 may be formed in the first insulating layer 120 and the buffer layer 111. The upper storage electrode 1154 may be connected to the light blocking pattern 177 through the opening 166.

The upper storage electrode 1154 may overlap the first electrode 3131 of the initialization transistor T3. The second insulating layer 160 may include an opening 167 overlapping the upper storage electrode 1154 and the first electrode 3131 of the initialization transistor T3. The opening 167 may be further formed in the first insulating layer 120. The upper storage electrode 1154 may be connected to the first electrode 3131 of the initialization transistor T3 through the opening 167.

Each of the first to third pixels PX1, PX2, and PX3 includes the upper storage electrode 1154, the lower storage electrode 1153, and the light blocking pattern 177. The upper storage electrode 1154, the lower storage electrode 1153, and the light blocking pattern 177 of the first to third pixel PX1, PX2, and PX3 may be disposed between the first scan line 151 and the second scan line 152 on a plane. Also, the upper storage electrode 1154, the lower storage electrode 1153, and the light blocking pattern 177 of the first to third pixels PX1, PX2, and PX3 may be disposed between the driving voltage line 172 and the first data line 171a. That is, the upper storage electrode 1154, the lower storage electrode 1153, and the light blocking pattern 177 of the first to third pixels PX1, PX2, and PX3 are surrounded by the first scan line 151, the second scan line 152, the driving voltage line 172, and the first data line 171a on a plane. The upper storage electrodes 1154 of the first to third pixels PX1, PX2, and PX3 may be disposed to be adjacent along the first direction D1. The upper storage electrode 1154 of the second pixel PX2 may be disposed below the upper storage electrode 1154 of the first pixel PX1 on a plane, and the upper storage electrode 1154 of the third pixel PX3 may be disposed below the upper storage electrode 1154 of the second pixel PX2. The lower storage electrodes 1153 of the first to third pixels PX1, PX2, and PX3 may be disposed to be adjacent along the first direction D1. On a plane, the lower storage electrode 1153 of the second pixel PX2 may be disposed below the lower storage electrode 1153 of the first pixel PX1, and the lower storage electrode 1153 of the third pixel PX3 may be disposed below the lower storage electrode 1153 of the second pixel PX2.

The planar shape of the upper storage electrode 1154 may be a polygon.

The planar shapes of the upper storage electrodes 1154 of the first to third pixels PX1, PX2, and PX3 may be the same or different. For example, the planar shapes of the upper storage electrodes 1154 of the first pixel PX1 and the second pixel PX2 may be symmetrical to each other, and the planar shapes of the upper storage electrodes 1154 of the second pixel PX2 and the third pixel PX3 may be the same.

The third conductive layer may further include a first connection electrode 178, a second connection electrode 179, a second common voltage auxiliary pattern 170b, an auxiliary common voltage line 170c, an initialization voltage auxiliary pattern 173a, a driving voltage auxiliary pattern 172a, and an auxiliary driving voltage line 172c.

Each pixel PX1, PX2, and PX3 may include a first connection electrode 178. The first connection electrode 178 of each pixel PX1, PX2, and PX3 may overlap each data line 171a, 171b, and 171c. The second insulating layer 160 may include an opening 161 overlapping the first connection electrode 178 and each data line 171a, 171b, and 171c. The opening 161 may be further formed in the first insulating layer 120 and the buffer layer 111. The first connection electrode 178 may be connected to the data line 171a, 171b, and 171c through the opening 161. The first connection electrode 178 of each pixel PX1, PX2, and PX3 may overlap the first electrode 2131 of the switching transistor T2. The second insulating layer 160 may include an opening 162 overlapping the first connection electrode 178 and the first electrode 2131 of the switching transistor T2. The opening 162 may be further formed in the first insulating layer 120. The first connection electrode 178 may be connected to the first electrode 2131 of the switching transistor T2 through the opening 162. Accordingly, the first connection electrode 178 may connect between each data line 171a, 171b, and 171c and the first electrode 2131 of the switching transistor T2. In the first pixel PX1, the first connection electrode 178 may connect between the first data line 171a and the first electrode 2131 of the switching transistor T2. In the second pixel PX2, the first connection electrode 178 may connect between the second data line 171b and the first electrode 2131 of the switching transistor T2. In the third pixel PX3, the first connection electrode 178 may connect between the third data line 171c and the first electrode 2131 of the switching transistor T2.

Each pixel PX1, PX2, and PX3 may include the second connection electrode 179. The second connection electrode 179 of each pixel PX1, PX2, and PX3 may overlap the second electrode 2133 of the switching transistor T2. The second insulating layer 160 may include an opening 163 overlapping the second connection electrode 179 and the second electrode 2133 of the switching transistor T2. The opening 163 may be further formed in the first insulating layer 120. The second connection electrode 179 may be connected to the second electrode 2133 of the switching transistor T2 through the opening 163. The second connection electrode 179 of each pixel PX1, PX2, and PX3 may overlap the lower storage electrode 1153. The second insulating layer 160 may include an opening 164 overlapping the second connection electrode 179 and the lower storage electrode 1153. The second connection electrode 179 may be connected to the lower storage electrode 1153 through the opening 164. Accordingly, in each pixel PX1, PX2, and PX3, the second connection electrode 179 may connect between the second electrode 2133 of the switching transistor T2 and the lower storage electrode 1153.

The second common voltage auxiliary pattern 170b may overlap the first common voltage auxiliary pattern 170a. The second insulating layer 160 may include an opening 1161 overlapping the first common voltage auxiliary pattern 170a and the second common voltage auxiliary pattern 170b. The second common voltage auxiliary pattern 170b may be connected to the first common voltage auxiliary pattern 170a through the opening 1161. The second common voltage auxiliary pattern 170b may overlap the common voltage line 170. The second insulating layer 160 may include an opening 1162 overlapping the common voltage line 170 and the second common voltage auxiliary pattern 170b. The opening 1162 may be further formed in the first insulating layer 120 and the buffer layer 111. The second common voltage auxiliary pattern 170b may be connected to the common voltage line 170 through the opening 1162. Accordingly, the second common voltage auxiliary pattern 170b may connect the common voltage line 170 and the first common voltage auxiliary pattern 170a. The first common voltage auxiliary pattern 170a and the second common voltage auxiliary pattern 170b may serve to lower the resistance of the common voltage line 170. The second common voltage auxiliary pattern 170b may be formed of a rod shape extending in the first direction D1. The first common voltage auxiliary pattern 170a may be repeatedly disposed in a disconnected shape for every three pixels PX1, PX2, and PX3.

The auxiliary common voltage line 170c may be extended in the second direction D2. The auxiliary common voltage line 170c may intersect the common voltage line 170, and at their intersections, the auxiliary common voltage line 170c and common voltage line 170 may overlap. The second insulating layer 160 may include an opening 1165 overlapping the auxiliary common voltage line 170c and the common voltage line 170. The opening 1165 may be further formed in the first insulating layer 120 and the buffer layer 111. The auxiliary common voltage line 170c may be connected to the common voltage line 170 through the opening 1165. The common voltage ELVSS may be applied to the auxiliary common voltage line 170c. The auxiliary common voltage line 170c may serve to lower the resistance of the common voltage line 170.

The initialization voltage auxiliary pattern 173a may overlap the initialization voltage line 173. The second insulating layer 160 may include an opening 1163 overlapping the initialization voltage line 173 and the initialization voltage auxiliary pattern 173a. The opening 1163 may be further formed in the first insulating layer 120 and the buffer layer 111. The initialization voltage auxiliary pattern 173a may be connected to the initialization voltage line 173 through the opening 1163. The initialization voltage auxiliary pattern 173a may serve to lower the resistance of the initialization voltage line 173. The initialization voltage auxiliary pattern 173a may be formed of a rod shape extending in the first direction D1. The initialization voltage auxiliary pattern 173a may be repeatedly disposed as a disconnected shape for every three pixels PX1, PX2, and PX3.

The initialization voltage auxiliary pattern 173a may overlap the second electrode 3133 of the initialization transistor T3. The second insulating layer 160 may include an opening 168 overlapping the initialization voltage auxiliary pattern 173a and the second electrode 3133 of the initialization transistor T3. The opening 168 may be further formed in the first insulating layer 120. The initialization voltage auxiliary pattern 173a may be connected to the second electrode 3133 of the initialization transistor T3 through the opening 168.

The driving voltage auxiliary pattern 172a may overlap the driving voltage line 172. The second insulating layer 160 may include an opening 1164 overlapping the driving voltage line 172 and the driving voltage auxiliary pattern 172a. The opening 1164 may be further formed in the first insulating layer 120 and the buffer layer 111. The driving voltage auxiliary pattern 172a may be connected to the driving voltage line 172 through the opening 1164. The driving voltage auxiliary pattern 172a may serve to lower the resistance of the driving voltage line 172. The driving voltage auxiliary pattern 172a may be formed in a rod shape extending in the first direction D1. The driving voltage auxiliary pattern 172a may be repeated in a disconnected shape for every three pixels PX1, PX2, and PX3.

The auxiliary driving voltage line 172c may be extended in the second direction D2. The auxiliary driving voltage line 172c may intersect the driving voltage line 172, and at their intersections, the auxiliary driving voltage line 172c and the driving voltage line 172 may overlap. The second insulating layer 160 may include an opening 1166 overlapping the auxiliary driving voltage line 172c and the driving voltage line 172. The opening 1166 may be further formed in the first insulating layer 120 and the buffer layer 111. The auxiliary driving voltage line 172c may be connected to the driving voltage line 172 through the opening 1166. The driving voltage ELVDD may be applied to the auxiliary driving voltage line 172c. The auxiliary driving voltage line 172c may serve to lower the resistance of the driving voltage line 172.

The auxiliary common voltage line 170c and the auxiliary driving voltage line 172c may be extended side by side. The auxiliary common voltage line 170c and the auxiliary driving voltage line 172c may be displaced alternately.

A third insulating layer 180 may be disposed on the third conductive layer including the first scan line 151, the second scan line 152, and the upper storage electrode 1154.

At least one of the first conductive layer, the second conductive layer, and the third conductive layer may include at least one among metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (T1), chromium (Cr), tantalum (Ta), and alloys thereof. Each of the first conductive layer, the second conductive layer, and the third conductive layer may be made of a single layer or multiple layers. For example, it may have a multi-layer structure including a lower layer containing titanium and an upper layer containing copper.

At least one among the buffer layer 111, the first insulating layer 120, the second insulating layer 160, and the third insulating layer 180 may include an inorganic insulating material such as a silicon nitride ($SiN_x$), a silicon oxide ($SiO_x$), a silicon oxynitride (SiON), and/or an organic insulating material such as a polyimide, an acryl-based polymer, and a siloxane-based polymer.

On the third insulating layer 180, a fourth conductive layer including a first pixel electrode 191a, a second pixel electrode 191b, and a third pixel electrode 191c may be disposed.

The pixel electrodes 191a, 191b, and 191c of each pixel PX1, PX2, and PX3 may overlap the upper storage electrode 1154. The third insulating layer 180 may include an opening 181 overlapping the pixel electrode 191a, 191b, and 191c and the upper storage electrode 1154. Each pixel electrode 191a, 191b, and 191c may be connected to the upper storage electrode 1154 through the opening 181.

The first pixel electrode 191a of the first pixel PX may overlap the part among the transistors T1, T2, and T3 of the first pixel PX1. The first pixel electrode 191a may overlap some of the transistors T1, T2, and T3 of the pixel other than the first pixel PX1. For example, the first pixel electrode 191a may overlap the switching transistor T2 of the second pixel PX2. The second pixel electrode 191b of the second pixel PX may overlap some of the transistors T1, T2, and T3 of the second pixel PX2. The second pixel electrode 191b may overlap some of the transistors T1, T2, and T3 of the pixel other than the second pixel PX2. For example, the second pixel electrode 191b may overlap the driving transistor T1 and the initialization transistor T3 of the third pixel PX3. The third pixel electrode 191c of the third pixel PX3 may overlap some of the transistors T1, T2, and T3 of the third pixel PX3. The third pixel electrode 191c may overlap some of the transistors T1, T2, and T3 of the pixel other than the third pixel PX3. At least some of the first to third pixel electrodes 191a, 191b, and 191c may overlap at least some of the first to third data lines 171a, 171b, and 171c. For example, the third pixel electrode 191c may overlap the first to third data lines 171a, 171b, and 171c.

In the present exemplary embodiment, the transistors T1, T2, and T3 of each pixel PX1, PX2, and PX3 may or may not overlap the pixel electrodes 191a, 191b, and 191c. That is, each pixel electrode 191a, 191b, and 191c may overlap other pixels.

The fourth conductive layer may further include a common voltage connection pattern 195. The common voltage connection pattern 195 may overlap the common voltage line 170. The common voltage connection pattern 195 may overlap the first common voltage auxiliary pattern 170a. The common voltage connection pattern 195 may overlap the second common voltage auxiliary pattern 170b. The third insulating layer 180 may include an opening 183 overlapping the second common voltage auxiliary pattern 170b and the common voltage connection pattern 195. The common voltage connection pattern 195 may be connected to the second common voltage auxiliary pattern 170b through the opening 183. The planar shape of the common voltage connection pattern 195 may consist of approximate polygons. For example, the common voltage connection pattern 195 may have an octagon and planar shape to which a rod shape protruded from one edge of the octagon is combined. The octagonal portion of the common voltage connection pattern 195 may be disposed at a portion where the common voltage line 170 and the auxiliary common voltage line 170c cross. The rod shape portion of the common voltage connection pattern 195 may overlap the common voltage line 170, the first common voltage auxiliary pattern 170a, and the second common voltage auxiliary pattern 170b.

The common voltage connection pattern 195 may overlap the auxiliary common voltage line 170c. In the above description, the common voltage connection pattern 195 is connected to the second common voltage auxiliary pattern 170b, but is not limited thereto. An opening may be formed in the third insulating layer of the portion where the common voltage connection pattern 195 and the auxiliary common voltage line 170c overlap, and the common voltage connection pattern 195 may be connected to the auxiliary common voltage line 170c through such opening. That is, the common voltage line 170, the first common voltage auxiliary pattern 170a, the second common voltage auxiliary pattern 170b, the auxiliary common voltage line 170c, and the common voltage connection pattern 195 can be connected by various methods. The common voltage line 170, the first common voltage auxiliary pattern 170a, the second common voltage auxiliary pattern 170b, the auxiliary common voltage line 170c, and the common voltage connection pattern 195 may be directly or indirectly connected to each other, and the common voltage ELVSS may be applied to them.

A fourth insulating layer 350 may be disposed on the fourth conductive layer. The fourth insulating layer 350 may include organic insulating materials such as polyacryl-based resins and polyimide-based resins. The fourth insulating layer 350 may include an opening 351 overlapping each pixel electrode 191a, 191b, and 191c.

An emission layer 370 may be disposed on the fourth insulating layer 350 and the pixel electrodes 191a, 191b, and 191c. The emission layer 370 may be disposed in the opening 351 of the fourth insulating layer 350. The emission layer 370 may include an organic emission material or an inorganic emission material. Although the emission layer 370 is shown as being formed entirely on the substrate 110, it is not limited in addition. The emission layer 370 may be disposed only within the opening 351 of the fourth insulating layer 350.

A common electrode 270 may be disposed on the emission layer 370. The common electrode 270 may be formed on the entire substrate 110. That is, one common electrode 270 may be positioned across a plurality of pixels PX1, PX2, and PX3. The common electrode 270 may overlap the common voltage connection pattern 195. The emission layer 370 may include an opening 352 overlapping the common electrode 270 and the common voltage connection pattern 195. The opening 352 may be further formed on the fourth insulating layer 350. The opening 352 may be formed through a laser drilling process. After forming the emission layer 370, by irradiating a laser on the common voltage connection pattern 195, some regions of the emission layer 370 and the fourth insulating layer 350 may be removed to form the opening 352.

The common electrode 270 may be connected to the common voltage connection pattern 195 through the opening 352. The common electrode 270 may be connected to the common voltage line 170 through the common voltage connection pattern 195. The common electrode 270 may be connected directly/indirectly to the common voltage line 170, the first common voltage auxiliary pattern 170a, the second common voltage auxiliary pattern 170b, the auxiliary common voltage line 170c, and the common voltage connection pattern 195. The common voltage ELVSS may be applied to the common electrode 270.

The common electrode 270 may overlap the data lines 171a, 171b, and 171c. A parasitic capacitor may be formed at a portion where each data line 171a, 171b, and 171c overlaps the common electrode 270. In the present exemplary embodiment, the data lines 171a, 171b, and 171c are disposed in the first conductive layer. The first insulating layer 120, the second insulating layer 160, the third insulating layer 180, and the fourth insulating layer 350 may be disposed between the data lines 171a, 171b, and 171c and the common electrode 270. However, in the region overlapping the opening 351 of the fourth insulating layer 350, the first insulating layer 120, the second insulating layer 160, and the third insulating layer 180 are disposed between the data lines 171a, 171b, and 171c and the common electrode 270. In comparison, when the data lines 171a, 171b, and 171c are disposed in the third conductive layer, the third insulating layer 180 and the fourth insulating layer 350 are disposed between the data lines 171a, 171b, and 171c and the common electrode 270. In the present exemplary embodiment, the distance between the data lines 171a, 171b, and 171c and the common electrode 270 is relatively longer compared to when the data lines 171a, 171b, and 171c are disposed in the third conductive layer, thereby reducing the capacitance of the parasitic capacitor. In addition, the design of minimizing the area of the opening 351 of the fourth insulating layer 350 in the region where the data lines 171a, 171b, and 171c overlap the common electrode 270 may further reduce the capacitance of the parasitic capacitor.

At least one of the fourth conductive layer and the common electrode 270 may be made of a transparent metal oxide such as indium tin oxide (ITO) and indium zinc oxide (IZO).

The pixel electrodes 191a, 191b, and 191c, the emission layer 370, and the common electrode 270 of each pixel PX1, PX2, and PX3 together may form the light emitting diode (LED) ED. The pixel electrodes 191a, 191b, and 191c may be anodes, and the common electrode 270 may be a cathode.

Next, a capacitance reduction amount of the parasitic capacitor in the display device according to an exemplary embodiment is described with reference to FIG. 11.

Figure 11:
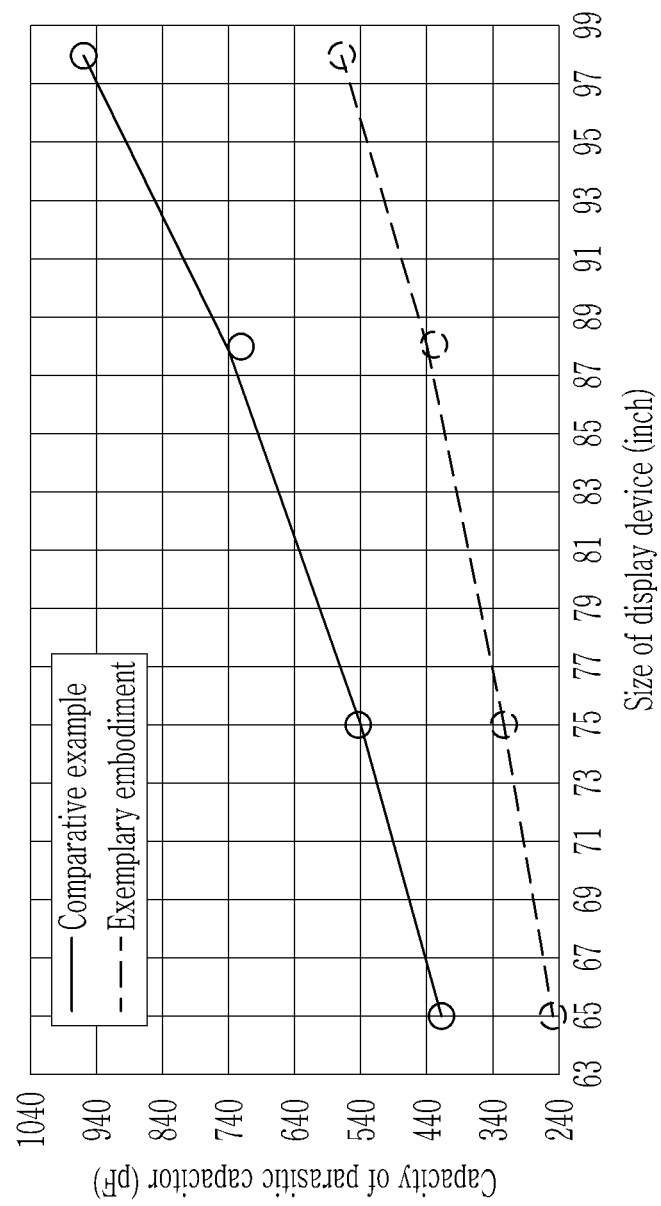
FIG. 11 is a graph showing a magnitude change of a capacitance of a parasitic capacitor according to a size of a display device.

FIG. 11 is a graph showing a magnitude change of a capacitance of a parasitic capacitor of a display device. The horizontal axis represents the size of the display device, and the vertical axis represents the capacitance of the parasitic capacitor formed by the overlapping of the data line and another conductive layer in the entire display device. FIG. 11 shows the display device according to an exemplary embodiment and the display device according to a comparative example. In the display device according to an exemplary embodiment, the data line is disposed in the first conductive layer, and the first scan line and the second scan line are disposed in the third conductive layer. In the display device according to the comparative example, the first scan line and the second scan line are disposed in the second conductive layer, and the data line is disposed in the third conductive layer. In the display device according to an exemplary embodiment and the display device according to the comparative example, the formation position of the common electrode is the same as that of the uppermost layer.

In the display device according to an exemplary embodiment and the display device according to the comparative example, as the size of the display device increases, the capacitance of the parasitic capacitor tends to increase. The larger the size of the display device, the larger the area where the data line overlaps other conductive layers, thus increasing the capacitance of the parasitic capacitor. When the size of the display device is 65 inches, the capacitance of the parasitic capacitor in the display device according to the comparative example is 420 pF, and the capacitance of the parasitic capacitor in the display device according to an exemplary embodiment is 250 pF. In the display device according to an exemplary embodiment, the capacitance of the parasitic capacitor may be reduced by about 170 pF by placing the data line in the first conductive layer and the first and second scan lines in the third conductive layer. When the size of the display device is 75 inches, the capacitance of the parasitic capacitor in the display device according to the comparative example is 550 pF, and the capacitance of the parasitic capacitor in the display device according to an exemplary embodiment is 320 pF. The capacitance of the parasitic capacitor in the display device according to an exemplary embodiment may be reduced by about 230 pF compared to the display device according to the comparative example. It may be confirmed that the larger the size of the display device, the greater the effect of reducing the capacitance of the parasitic capacitor in the display device according to an exemplary embodiment. When the size of the display device is 98 inches, the capacitance of the parasitic capacitor in the display device according to the comparative example is 960 pF, and the capacitance of the parasitic capacitor in the display device according to an exemplary embodiment is 570 pF. The capacitance of the parasitic capacitor in the display device according to an exemplary embodiment may be reduced by about 390 pF compared to the display device according to the comparative example.

Next, the display device according to an exemplary embodiment is described with reference to FIG. 12 and FIG. 13.

Figure 12:
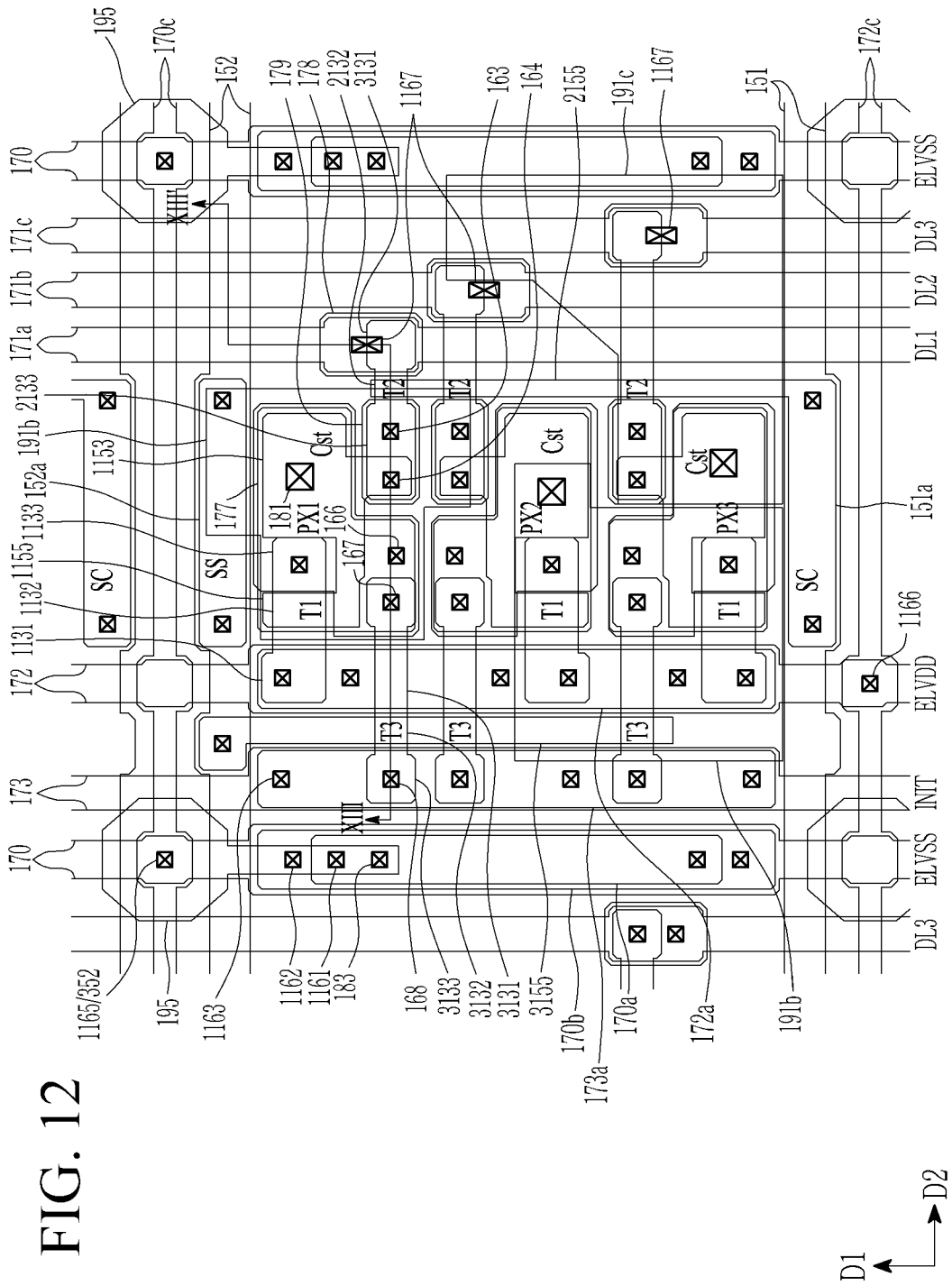
FIG. 12 is a top plan view showing a part of a display device according to an exemplary embodiment.
Figure 13:
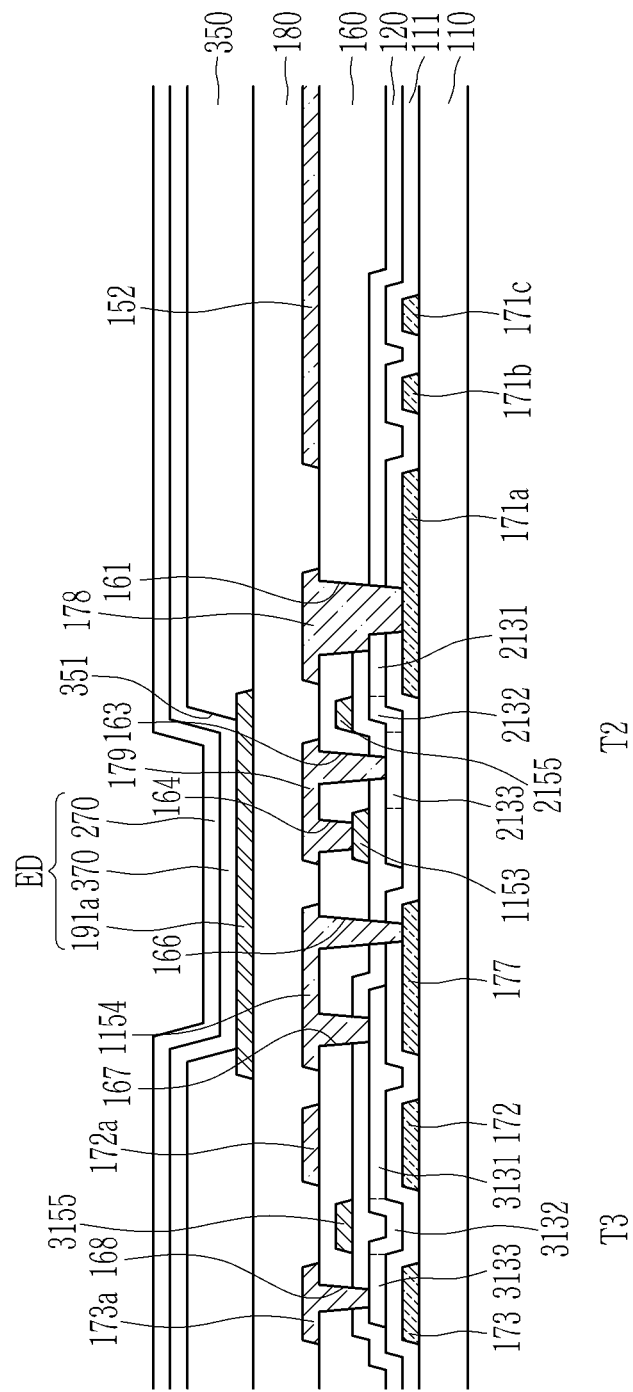
FIG. 13 is a cross-sectional view of a display device according to an exemplary embodiment taken along a line XIII-XIII' of FIG. 12.

The display device according to an exemplary embodiment shown in FIG. 12 and FIG. 13 is the mostly the same as the display device according to the exemplary embodiment shown in FIG. 1 to FIG. 10 such that a description of the same portions is omitted. In the present exemplary embodiment, the connection structure of the data line and the switching transistor is different from that of the previous exemplary embodiments and this is further described.

FIG. 12 is a top plan view showing a part of a display device according to an exemplary embodiment, and FIG. 13 is a cross-sectional view of a display device according to an exemplary embodiment taken along a line XIII-XIII' of FIG. 12.

As shown in FIG. 12 and FIG. 13, a first data line 171a, a second data line 171b, and a third data line 171c are disposed on the substrate 110. The first electrode 2131 of the switching transistor T2 of each pixel PX1, PX2, and PX3 may overlap each data line 171a, 171b, and 171c. The first connection electrode 178 of each pixel may overlap each data line 171a, 171b, and 171c and the first electrode 2131 of the switching transistor T2.

In the previous exemplary embodiment, the opening for connecting the first connection electrode 178 and the data lines 171a, 171b, and 171c and the opening for connecting the first connection electrode 178 and the first electrode 2131 of the switching transistor T2 are separately formed. In the present exemplary embodiment, a single opening 1167 for connecting the first connection electrode 178, the data lines 171a, 171b, and 171c, and the first electrode 2131 of the switching transistor T2 is formed. The opening 1167 may overlap the first connection electrode 178, the data lines 171a, 171b, and 171c, and the first electrode 2131 of the switching transistor T2. The opening 167 may be formed in the buffer layer 111, the first insulating layer 120, and the second insulating layer 160. The upper surface of the data lines 171a, 171b, and 171c and the side of the first electrode 2131 of the switching transistor T2 may be exposed by the opening 167. The first connection electrode 178 may be formed to fill the opening 167, the first connection electrode 178 may be connected to the data line 171a, 171b, and 171c and may be connected to the first electrode 2131 of the switching transistor T2. That is, the first connection electrode 178 may connect the data lines 171a, 171b, and 171c and the first electrode 2131 of the switching transistor T2.

In the display device according to the present exemplary embodiment, like the previous exemplary embodiment, by placing the data line in the first conductive layer and the first scan line and the second scan line in the third conductive layer, the capacitance of the parasitic capacitor formed by the data line overlapping the other conductive layer may be reduced.

Next, the display device according to an exemplary embodiment is described with reference to FIG. 14 and FIG. 15.

Figure 14:
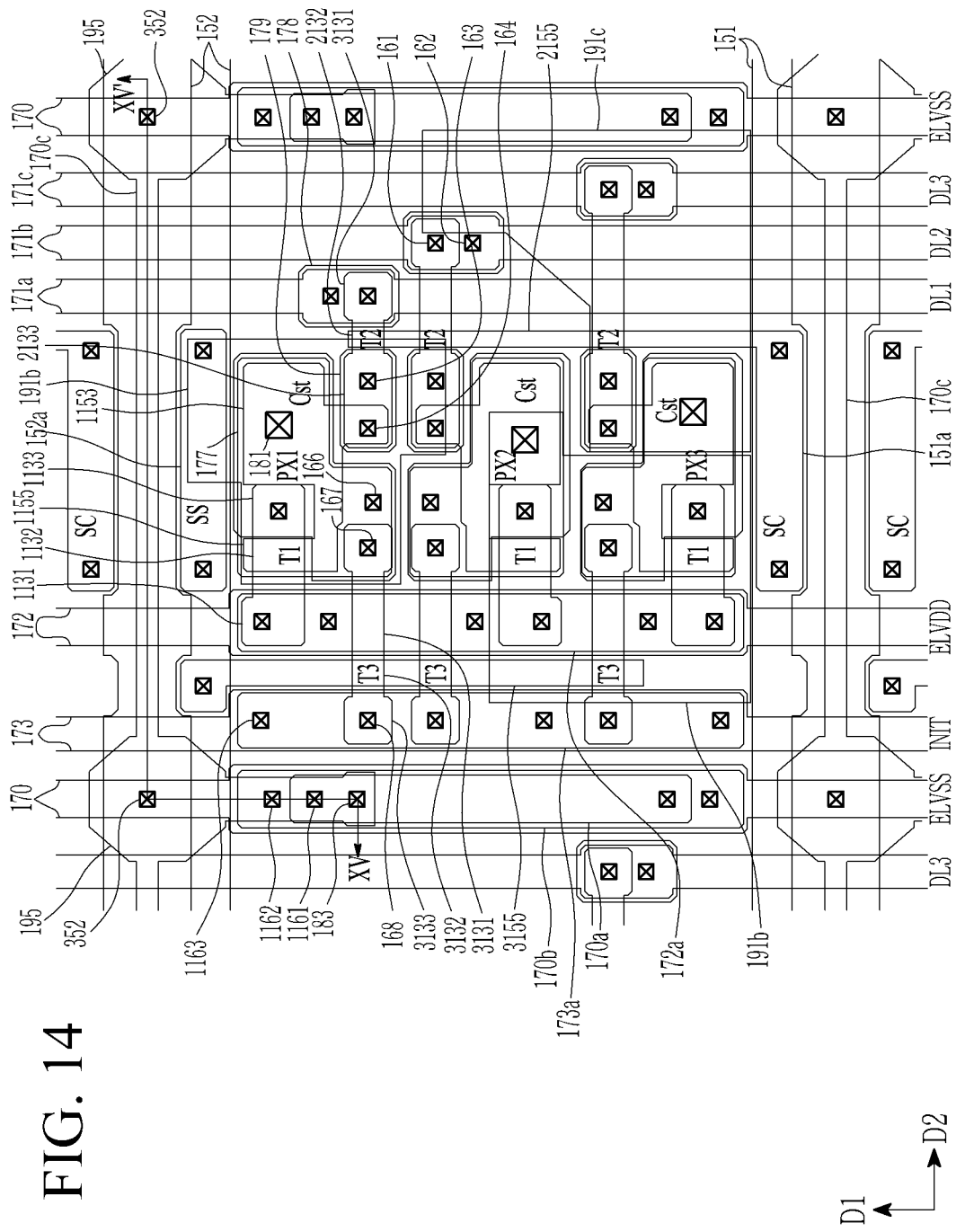
FIG. 14 is a top plan view showing a part of a display device according to an exemplary embodiment.
Figure 15:
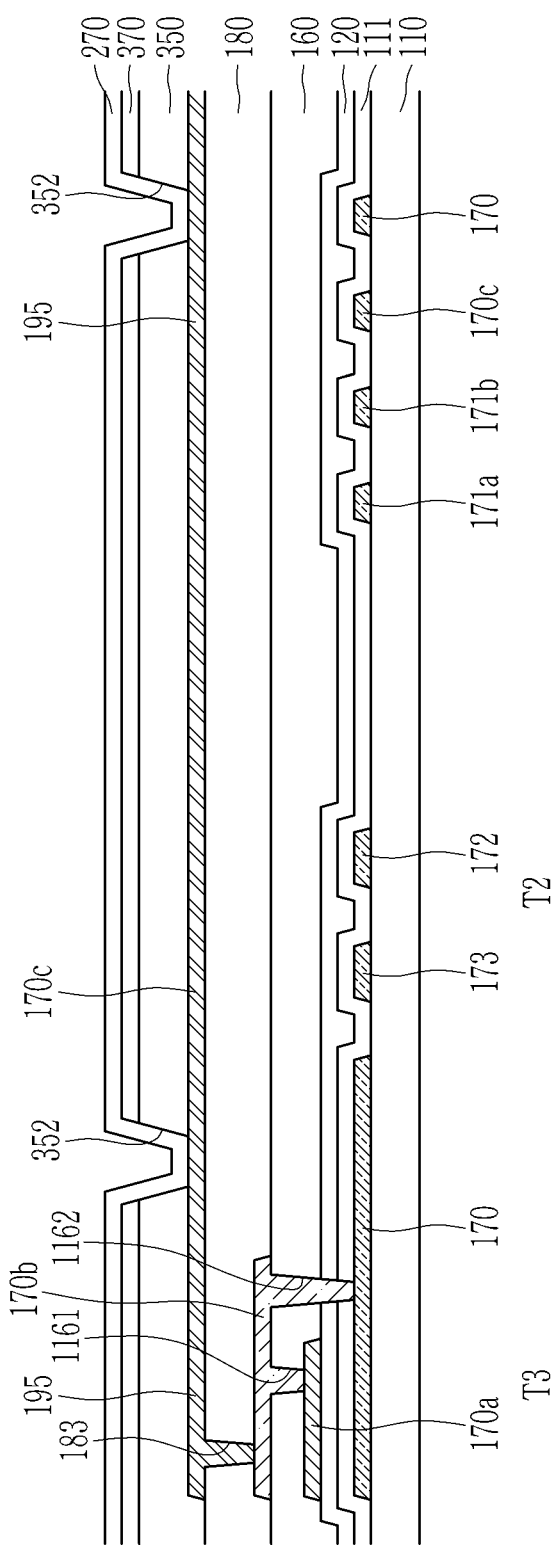
FIG. 15 is a cross-sectional view of a display device according to an exemplary embodiment taken along a line XV-XV' of FIG. 14.

The display device according to the exemplary embodiment shown in FIG. 14 and FIG. 15 is mostly the same as the display device according to the exemplary embodiment shown in FIG. 1 to FIG. 10 such that a description of the same portions is omitted. In the present exemplary embodiment, the layer on which the auxiliary common voltage line is formed is different from the previous exemplary embodiment and is further described below.

FIG. 14 is a top plan view showing a part of a display device according to an exemplary embodiment, and FIG. 15 is a cross-sectional view of a display device according to an exemplary embodiment taken along a line XV-XV' of FIG. 14.

As shown in FIG. 14 and FIG. 15, the first conductive layer including the first data line 171a, the second data line 171b, the third data line 171c, and the common voltage line 170 is disposed on the substrate 110. The first data line 171a, the second data line 171b, the third data line 171c, and the common voltage line 170 may be extended in the first direction D1.

The first common voltage auxiliary pattern 170a and the second common voltage auxiliary pattern 170b may be disposed to overlap the common voltage line 170. The first common voltage auxiliary pattern 170a and the second common voltage auxiliary pattern 170b may be disposed on the different layers. For example, the first common voltage auxiliary pattern 170a may be disposed in the second conductive layer, and the second common voltage auxiliary pattern 170b may be disposed in the third conductive layer. The common voltage connection pattern 195 may be disposed to overlap the common voltage line 170. The common voltage connection pattern 195 may be disposed in the fourth conductive layer. The common voltage line 170, the first common voltage auxiliary pattern 170a, the second common voltage auxiliary pattern 170b, and the common voltage connection pattern 195 may be directly or indirectly connected to each other, and the common voltage ELVSS may be applied to them.

The auxiliary common voltage line 170c may be disposed to intersect the common voltage line 170. The auxiliary common voltage line 170c may be extended in the second direction D2. In the preceding exemplary embodiment, the auxiliary common voltage line 170c may be disposed in the third conductive layer, and in the present exemplary embodiment, the auxiliary common voltage line 170c may be disposed in the fourth conductive layer. In the present exemplary embodiment, the auxiliary driving voltage line may be omitted. In the previous exemplary embodiment, the auxiliary common voltage line and the auxiliary driving voltage line are alternately disposed, and in the present exemplary embodiment, the auxiliary driving voltage line is omitted, and only the auxiliary common voltage line 170c may be disposed. The auxiliary common voltage line 170c may be disposed between the first scan line 151 and the second scan line 152. The auxiliary common voltage line 170c may intersect the data lines 171a, 171b, and 171c, and they are overlapped with each other at their intersections, thereby incurring the parasitic capacitors. In the present exemplary embodiment, since the data lines 171a, 171b, and 171c are disposed in the first conductive layer, and the auxiliary common voltage line 170c is disposed in the fourth conductive layer, the capacitance of the parasitic capacitor may be further reduced compared to the previous exemplary embodiment.

The auxiliary common voltage line 170c may be connected to the common voltage connection pattern 195 and can be integrally formed. For example, the common voltage connection pattern 195 on a plane may have a shape protruded from the auxiliary common voltage line 170c.

In the display device by the present exemplary embodiment, like the previous exemplary embodiment, the data line is disposed in the first conductive layer, and the first scan line and second scan line are disposed in the third conductive layer, so that the capacitance of the parasitic capacitor due to the data line overlapping other conductive layers may be reduced.

Next, the display device according to an exemplary embodiment is described with reference to FIG. 16 and FIG. 17. Particularly, the parasitic capacitor between the data line and the common electrode is described.

Figure 16:
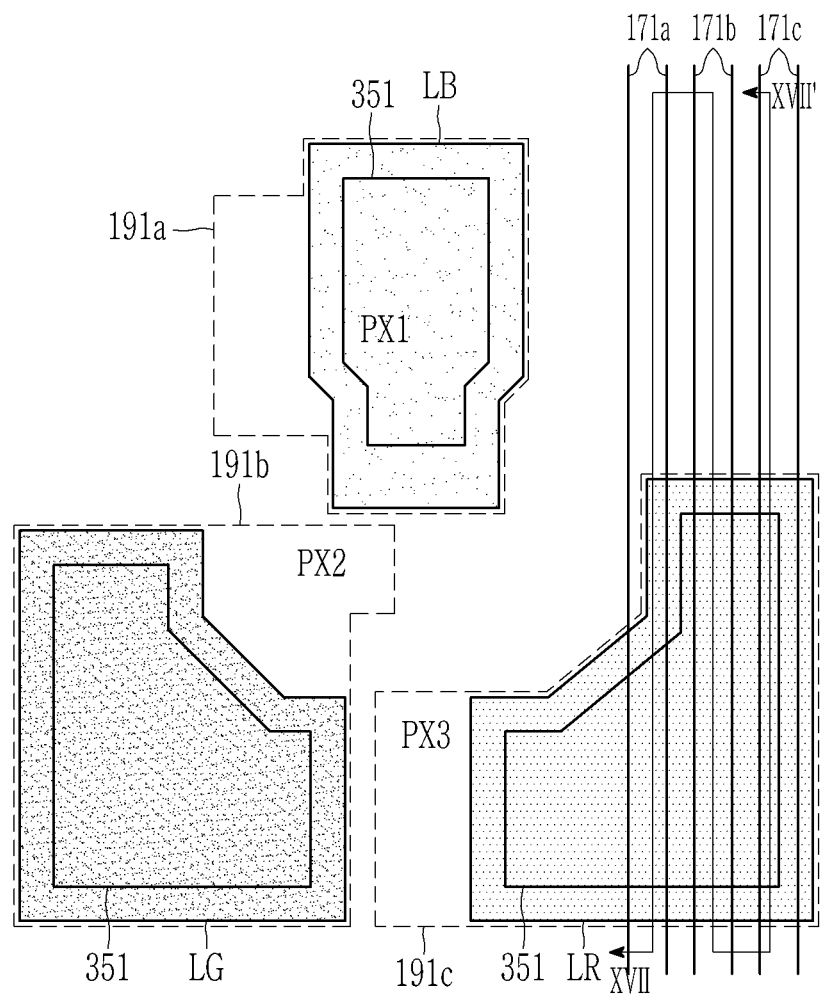
FIG. 16 is a top plan view showing a partial constituent element of a display device according to an exemplary embodiment.
Figure 17:
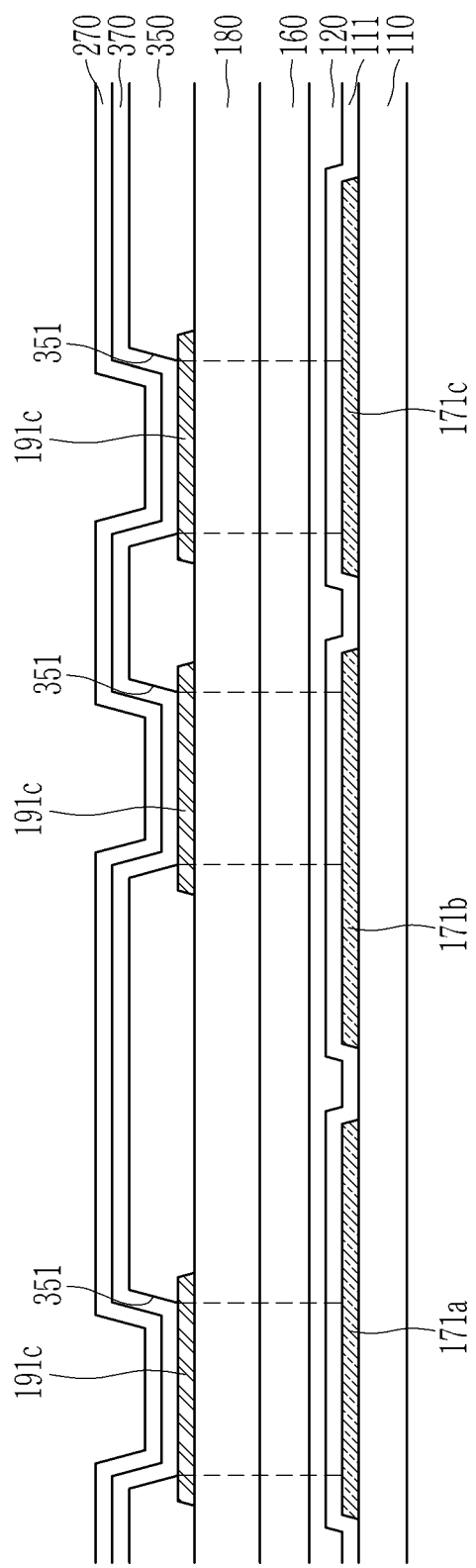
FIG. 17 is a cross-sectional view of a display device according to an exemplary embodiment taken along a line XVII-XVII' of FIG. 16.
Figure 18:
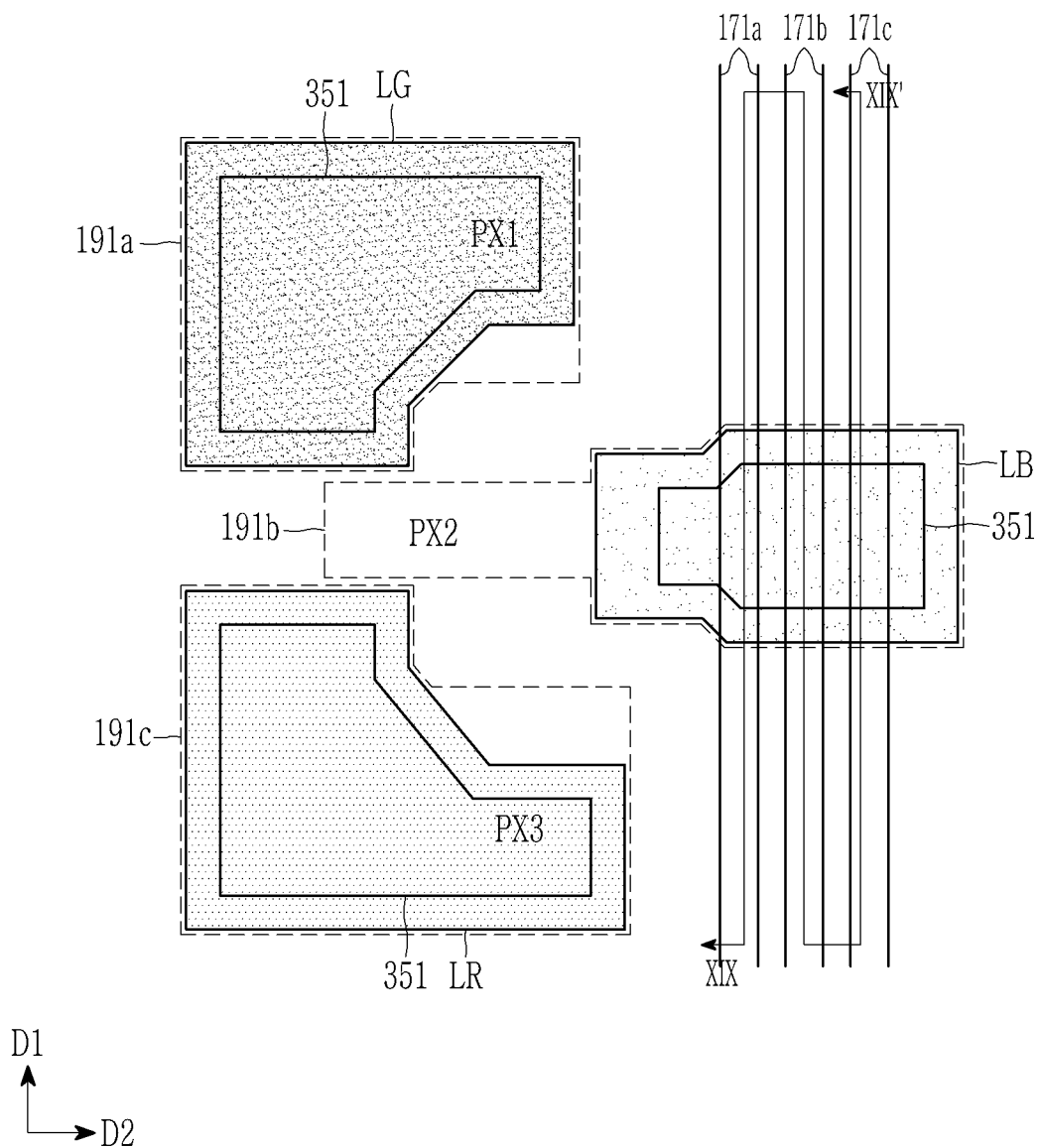
FIG. 18 is a top plan view showing a partial constituent element of a display device according to an exemplary embodiment.

FIG. 17 is a cross-sectional view of a display device according to an exemplary embodiment taken along a line XVII-XVII' of FIG. 16, and FIG. 18 is a top plan view showing a partial constituent element of a display device according to an exemplary embodiment. FIG. 16 and FIG. 17 omit the scan line, the driving voltage line, the transistor, etc. in the display device according to the exemplary embodiment shown in FIG. 1 to FIG. 10, and show some constituent elements such as the data line, the pixel electrode, the emission layer, the common electrode, etc.

As shown in FIG. 16 and FIG. 17, the first data line 171a, the second data line 171b, and the third data line 171c may be disposed on the substrate 110. The first data line 171a, the second data line 171b, and the third data line 171c may be elongated along the first direction D1 and disposed to be adjacent along the second direction D2.

The plurality of pixels PX1, PX2, and PX3 may include the first pixel PX1, the second pixel PX2, and the third pixel PX3. The first pixel PX1 may be a pixel displaying blue, the second pixel PX2 may be a pixel displaying green, and the third pixel PX3 may be a pixel displaying red.

Each pixel PX1, PX2, and PX3 may include the pixel electrodes 191a, 191b, and 191c. The buffer layer 111, the first insulating layer 120, the second insulating layer 160, and the third insulating layer 180 may be disposed between the substrate 110 and the pixel electrodes 191a, 191b, and 191c.

The fourth insulating layer 350 may be disposed on the pixel electrodes 191a, 191b, and 191c, and the fourth insulating layer 350 may include the opening 351 overlapping the pixel electrode 191a, 191b, and 191c. The emission layer 370 may be disposed on the pixel electrodes 191a, 191b, and 191c and the fourth insulating layer 350, and the common electrode 270 may be positioned on the emission layer 370. The pixel electrodes 191a, 191b, and 191c, the emission layer 370, and the common electrode 270 together may form the light emitting diode (LED) ED. Light may be emitted in the region corresponding to the opening 351. At the edge of the opening 351, the fourth insulating layer 350 has a tapered shape, so the light emitting regions LR, LG, and LB in which light is actually recognized may be larger than the area of the opening 351. The light emitting regions LR, LG, and LB may include a red light emitting region LR, a green light emitting region LG, and a blue light emitting region LB. The red light emitting region LR may be a region displaying red, the green light emitting region LG may be a region displaying green, and the blue light emitting region LB may be a region displaying blue. The emission layer 370 is separately provided for each pixel PX1, PX2 and PX3 to emit red, green, and blue light. Alternatively, the emission layer 370 may be formed as a whole to emit blue light, and a separate color conversion layer may be provided to emit red, green, and blue light for each pixel PX1, PX2, and PX3.

In the present exemplary embodiment, the first pixel electrode 191a may overlap the blue light emitting region LB, the second pixel electrode 191b may overlap the green light emitting region LG, and the third pixel electrode 191c may overlap the red light emitting region LR.

In the present exemplary embodiment, the first to third data lines 171a, 171b, and 171c may overlap the red light emitting region LR. The first to third data lines 171a, 171b, and 171c may not overlap the green light emitting region LG and the blue light emitting region LB. However, this is only an example, and the arrangement of the red light emitting region LR, the green light emitting region LG, and the blue light emitting region LB may be variously changed. Also, the first to third data lines 171a, 171b, and 171c may overlap the third pixel electrode 191c. The first to third data lines 171a, 171b, and 171c may not overlap the first pixel electrode 191a and the second pixel electrode 191b. However, this is only one example, and the arrangement of the first pixel electrode 191a, the second pixel electrode 191b, and the third pixel electrode 191c may also be variously changed according to the arrangement of the red light emitting region LR, the green light emitting region LG, and the blue light emitting region LB.

The buffer layer 111, the first insulating layer 120, the second insulating layer 160, and the third insulating layer 180 may be disposed between the first to third data lines 171a, 171b, and 171c and the common electrode 270. In addition, the fourth insulating layer 350 may be further disposed between the first to third data lines 171a, 171b, and 171c and the common electrode 270 in the portion that does not overlap the opening 351.

In the display device according to the present exemplary embodiment, the distance between the data lines 171a, 171b, and 171c and the common electrode 270 is relatively long compared to the case where the data lines 171a, 171b, and 171c are disposed in the third conductive layer, so that the capacitance of the parasitic capacitor may be reduced. Also, in the display device according to the present exemplary embodiment, since the first to third data lines 171a, 171b, and 171c overlap the red light emitting region LR but do not overlap the green and blue light emitting regions LG and LB, the area occupied by the fourth insulating layer 350 is widened between the first to third data lines 171a, 171b, and 171c and the common electrode 270, thereby further reducing the capacitance of the parasitic capacitor.

Next, the display device according to an exemplary embodiment is described with reference to FIG. 18 and FIG. 19.

Figure 19:
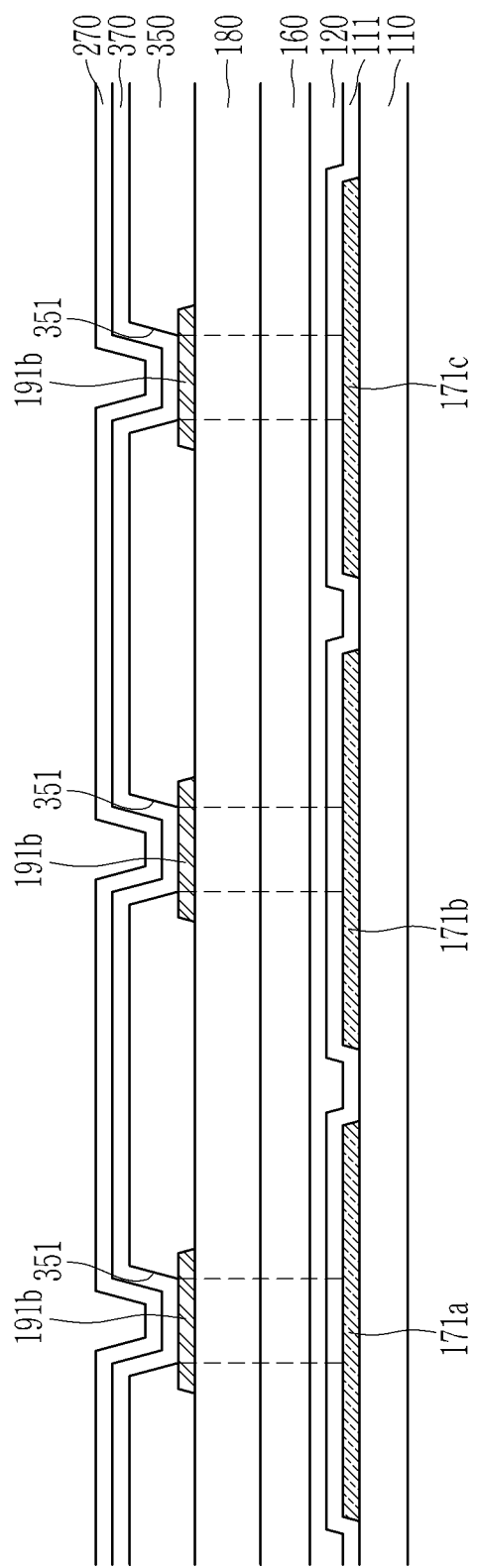
FIG. 19 is a cross-sectional view of a display device according to an exemplary embodiment taken along a line XIX-XIX' of FIG. 18.

The display device according to the exemplary embodiment shown in FIG. 18 and FIG. 19 is mostly the same as display device according to the exemplary embodiment shown in shown in FIG. 16 and FIG. 17 such that a description of the same portions is omitted. In the present exemplary embodiment, the arrangement of the light emitting region is different from the previous exemplary embodiment and is further described below.

FIG. 18 is a top plan view showing a partial constituent element of a display device according to an exemplary embodiment, and FIG. 19 is a cross-sectional view of a display device according to an exemplary embodiment taken along a line XIX-XIX' of FIG. 18. FIG. 18 and FIG. 19 omit the scan line, the driving voltage line, the transistor, etc. in the display device according to the exemplary embodiment shown in FIG. 1 to FIG. 10, and show some constituent elements such as the data line, the pixel electrode, the emission layer, the common electrode, etc.

As shown in FIG. 18 and FIG. 19, the first data line 171*a*, the second data line 171*b*, and the third data line 171*c* may be disposed on the substrate 110. The first data line 171*a*, the second data line 171*b*, and the third data line 171*c* may be elongated along the first direction D1 and disposed to be adjacent along the second direction D2.

A plurality of pixels PX1, PX2, and PX3 may include the first pixel PX1, the second pixel PX2, and the third pixel PX3. The first pixel PX1 may be a pixel displaying green, the second pixel PX2 may be a pixel displaying blue, and the third pixel PX3 may be a pixel displaying red.

Each pixel PX1, PX2, and PX3 may include the pixel electrodes 191*a*, 191*b*, and 191*c*. The buffer layer 111, the first insulating layer 120, the second insulating layer 160, and the third insulating layer 180 may be disposed between the substrate 110 and the pixel electrodes 191*a*, 191*b*, and 191*c*.

The fourth insulating layer 350 may be disposed on the pixel electrodes 191*a*, 191*b*, and 191*c*, and the fourth insulating layer 350 may include the opening 351 overlapping the pixel electrodes 191*a*, 191*b*, and 191*c*. The emission layer 370 may be disposed on the pixel electrodes 191*a*, 191*b*, and 191*c* and the fourth insulating layer 350, and the common electrode 270 may be disposed on the emission layer 370. The pixel electrodes 191*a*, 191*b*, and 191*c*, the emission layer 370, and the common electrode 270 together may form the light emitting diode (LED) ED. Light may be emitted in the region corresponding to the opening 351. At the edge of the opening 351, the fourth insulating layer 350 has a tapered shape, so the light emitting regions LR, LG, and LB in which light is actually visible may be larger than the area of the opening 351. The light emitting regions LR, LG, and LB may include a red light emitting regions LR, a green light emitting regions LG, and a blue light emitting region LB. The red light emitting region LR may be a region displaying red, the green light emitting region LG may be a region displaying green, and the blue light emitting region LB may be a region displaying blue. An emission layer 370 is separately provided for each pixel PX1, PX2, and PX3 to emit red, green, and blue light. Alternatively, the emission layer 370 may be formed as a whole to emit blue light, and a separate color conversion layer may be provided to emit red, green, and blue light for each pixel PX1, PX2, and PX3.

In the case of the exemplary embodiment above, the blue light emitting region LB is disposed at the upper center, the green light emitting region LG is disposed at the lower left, and the red light emitting region LR is disposed at the lower right on the plane. In the present exemplary embodiment, the arrangement of the light emitting regions LR, LG, and LB on a plane is similar to a rotation of about 90 degrees in a clockwise direction from the previous exemplary embodiment. That is, the blue light emitting region LB may be disposed at the right center on a plane, the green light emitting region LG may be disposed at the upper left, and the red light emitting region LR may be disposed at the lower left.

In the present exemplary embodiment, the first pixel electrode 191*a* may overlap the green light emitting region LG, the second pixel electrode 191*b* may overlap the blue light emitting region LB, and the third pixel electrode 191*c* may overlap the red light emitting region LR.

In the present exemplary embodiment, the first to third data lines 171*a*, 171*b*, and 171*c* may overlap the blue light emitting region LB. The first to third data lines 171*a*, 171*b*, and 171*c* may not overlap the red light emitting region LR and the green light emitting region LG. However, this is only an example, and the arrangement of the red light emitting region LR, the green light emitting region LG, and the blue light emitting region LB may be variously changed. Also, the first to third data lines 171*a*, 171*b*, and 171*c* may overlap the second pixel electrode 191*b*. The first to third data lines 171*a*, 171*b*, and 171*c* may not overlap the first pixel electrode 191*a* and the third pixel electrode 191*c*. However, this is only one example, and the arrangement of the first pixel electrode 191*a*, the second pixel electrode 191*b*, and the third pixel electrode 191*c* may also be variously changed according to the arrangement of the red light emitting region LR, the green light emitting region LG, and the blue light emitting region LB.

The buffer layer 111, the first insulating layer 120, the second insulating layer 160, and the third insulating layer 180 may be disposed between the first to third data lines 171*a*, 171*b*, and 171*c* and the common electrode 270. In addition, the fourth insulating layer 350 may be further disposed between the first to third data lines 171*a*, 171*b*, and 171*c* and the common electrode 270 in a portion that does not overlap the opening 351.

In the display device according to the present exemplary embodiment, the distance between the data lines 171*a*, 171*b*, and 171*c* and the common electrode 270 is relatively long compared to the case where the data lines 171*a*, 171*b*, and 171*c* are disposed in the third conductive layer, thereby reducing the capacitance of the parasitic capacitor. In addition, since the first to third data lines 171*a*, 171*b*, and 171*c* overlap the blue light emitting region LB and do not overlap the red and green light emitting regions LR and LG in the display device according to the present exemplary embodiment, the area in which the fourth insulating layer 350 is disposed between the first to third data lines 171*a*, 171*b*, and 171*c* and the common electrode 270 is increased, thereby the capacitance of the parasitic capacitor may be further reduced. The size of the blue light emitting region LB is relatively smaller than that of the red and green light emitting regions LR and LG. In the present exemplary embodiment, the first to third data lines 171*a*, 171*b*, and 171*c* overlap only the blue light emitting region LB, so the capacitance of the parasitic capacitor may be further reduced compared to the case that the first to third data lines 171*a*, 171*b*, and 171*c* overlap the red light emitting regions LR or the green light emitting region LG.

Next, the display device according to an exemplary embodiment is described with reference to FIG. 20.

Figure 20:
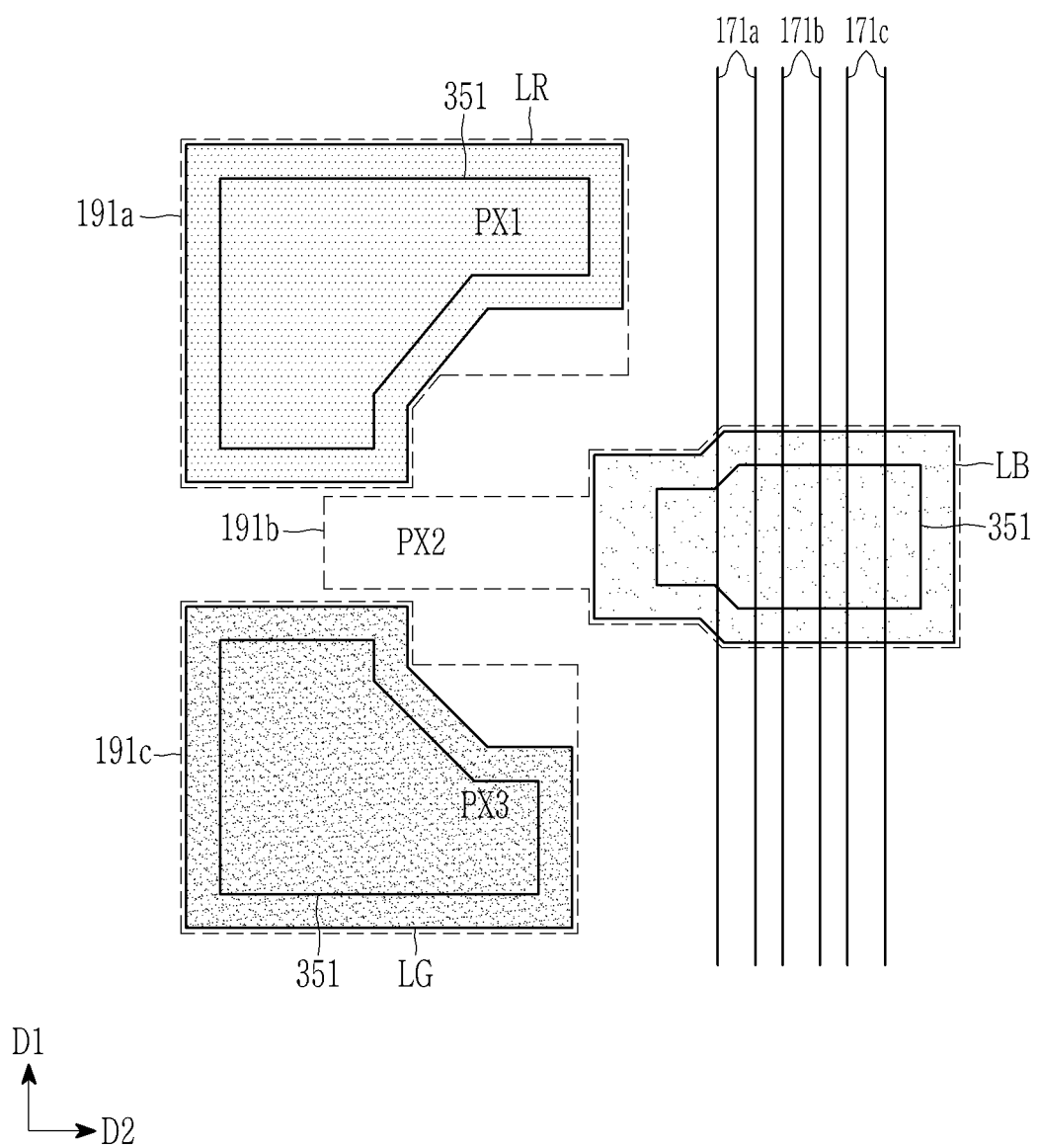
FIG. 20 is a top plan view showing a partial constituent element of a display device according to an exemplary embodiment.

The display device according to the exemplary embodiment shown in FIG. 20 is the same as most of the display device according to the exemplary embodiment shown in FIG. 18 and FIG. 19 such that a description of the same portions is omitted. In the present exemplary embodiment, the arrangement of the light emitting region is different from the previous exemplary embodiment and is further described below.

FIG. 20 is a top plan view showing some constituent elements of a display device according to an exemplary embodiment.

As shown in FIG. 20, the first data line 171*a*, the second data line 171*b*, and the third data line 171*c* may be disposed on the substrate 110. The first data line 171*a*, the second data line 171*b*, and the third data line 171*c* may be elongated along the first direction D1 and disposed to be adjacent along the second direction D2.

A plurality of pixels PX1, PX2, and PX3 may include the first pixel PX1, the second pixel PX2, and the third pixel PX3. The first pixel PX1 may be a pixel displaying red, the second pixel PX2 may be a pixel displaying blue, and the third pixel PX3 may be a pixel displaying green.

In the case of the exemplary embodiment above, the blue light emitting region LB is disposed at the right center on a plane, the green light emitting region LG is disposed at the upper left, and the red light emitting region LR is disposed at the lower left. In the present exemplary embodiment, the positions of the blue light emitting region LB are the same, and the positions of the green light emitting region LG and the red light emitting region LR may be interchanged. That is, on a plane, the blue light emitting region LB may be disposed at the center of the right, the green light emitting region LG may be disposed at the lower left, and the red light emitting region LR may be disposed at the upper left.

In the present exemplary embodiment, the first pixel electrode 191a may overlap the red light emitting region LR, the second pixel electrode 191b may overlap the blue light emitting region LB, and the third pixel electrode 191c may overlap the green light emitting region LG.

In the present exemplary embodiment, the first to third data lines 171a, 171b, and 171c may overlap the blue light emitting region LB. The first to third data lines 171a, 171b, and 171c may not overlap the red light emitting region LR and the green light emitting region LG. However, this is only an example, and the arrangement of the red light emitting region LR, the green light emitting region LG, and the blue light emitting region LB may be variously changed. Also, the first to third data lines 171a, 171b, and 171c may overlap the second pixel electrode 191b. The first to third data lines 171a, 171b, and 171c may not overlap the first pixel electrode 191a and the third pixel electrode 191c. However, this is only one example, and the arrangement of the first pixel electrode 191a, the second pixel electrode 191b, and the third pixel electrode 191c may also be variously changed according to the arrangement of the red light emitting region LR, the green light emitting region LG, and the blue light emitting region LB.

In the display device according to the present exemplary embodiment, the distance between the data lines 171a, 171b, and 171c and the common electrode 270 is relatively long compared to the case where the data lines 171a, 171b, and 171c are disposed in the third conductive layer, thereby reducing the capacitance of the parasitic capacitor. In addition, since the first to third data lines 171a, 171b, and 171c overlap the blue light emitting region LB and do not overlap the red and green light emitting regions LR and LG in the display device according to the present exemplary embodiment, the area in which the fourth insulating layer 350 is disposed between the first to third data lines 171a, 171b, and 171c and the common electrode 270 is increased, thereby the capacitance of the parasitic capacitor may be further reduced. The size of the blue light emitting region LB is relatively smaller than that of the red and green light emitting regions LR and LG. In the present exemplary embodiment, the first to third data lines 171a, 171b, and 171c overlap only the blue light emitting region LB, so the capacitance of the parasitic capacitor may be further reduced compared to the case that the first to third data lines 171a, 171b, and 171c overlap the red light emitting regions LR or the green light emitting region LG.

Next, the cross-sectional structure of the display device according to an exemplary embodiment is further described with reference to FIG. 21. It is described together with reference to FIG. 1 to FIG. 10. Previously, in FIG. 1 to FIG. 10, it is explained that the common electrode is disposed at the uppermost layer. Another layer may be further positioned on the common electrode, which is described below.

Figure 21:
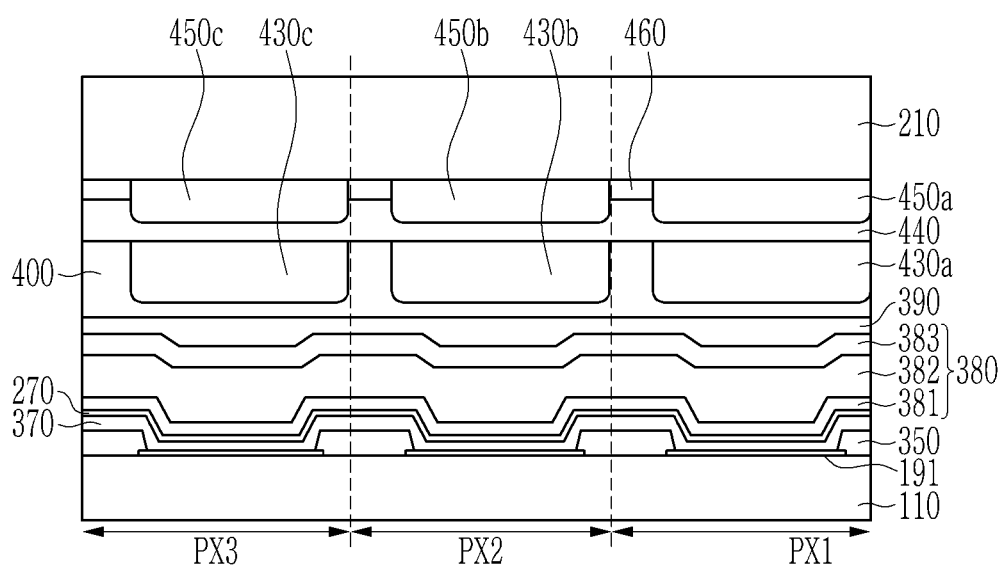
FIG. 21 is a cross-sectional view showing a partial constituent element of a display device according to an exemplary embodiment.

FIG. 21 is a cross-sectional view of some constituent elements of a display device according to an exemplary embodiment. In FIG. 21, compared to the display device according to the exemplary embodiment shown in FIG. 1 to FIG. 10, scan lines, driving voltage lines, transistors, etc. are omitted, and some constituent elements such as the pixel electrode, the emission layer, and the common electrode are shown. In addition, FIG. 21 further shows another layer disposed above the common electrode.

As shown in FIG. 21, the display device according to an exemplary embodiment may include a plurality of pixels PX1, PX2, and PX3. On the substrate 110, the pixel electrodes 191a, 191b, and 191c may be disposed for each pixel PX1, PX2, and PX3. A plurality of transistors and insulating layers disposed between the substrate 110 and the pixel electrode 191a, 191b, and 191c are omitted, but for example, may be disposed as shown in FIG. 1 to FIG. 10.

The fourth insulating layer 350 may be disposed on the pixel electrodes 191a, 191b, and 191c, and the fourth insulating layer 350 may include the opening 351. The emission layer 370 may be disposed on the pixel electrodes 191a, 191b, and 191c and the fourth insulating layer 350, and the common electrode 270 may be disposed on the emission layer 370. The emission layer 370 may include a light emitting material that emits a first color light, which may be blue light.

An encapsulation layer 380 including a plurality of insulating layers 381, 382, and 383 may be disposed on the common electrode 270. The insulating layer 381 and the insulating layer 383 may include an inorganic insulating material, and the insulating layer 382 disposed between the insulating layer 381 and the insulating layer 383 may include an organic insulating material.

A filling layer 390 including a filler may be disposed on the encapsulation layer 380. A cover layer 400 including an insulating material and a plurality of color conversion layers 430a and 430b and a transmission layer 430c may be disposed on the filling layer 390.

The transmission layer 430c may pass incident light. That is, the transmission layer 430c may transmit the first color light, which may be blue light. The transmission layer 430c may include a polymer material that transmits the first color light. The region in which the transmission layer 430c is disposed may correspond to a light emitting region emitting blue light, and the transmission layer 430c may pass the incident first color light without including a separate semiconductor nanocrystal.

The color conversion layers 430a and 430b may include different semiconductor nanocrystals. For example, the first color light incident on the color conversion layer 430a may be converted into a second color light and be emitted by a semiconductor nanocrystal included in the color conversion layer 430b. The first color light incident on the color conversion layer 430b may be converted into a third color light and emitted by the semiconductor nanocrystal included in the color conversion layer 430b.

The semiconductor nanocrystal may include at least one of a phosphor material and a quantum dot material that convert the incident first color light into the second color light or the third color light.

The core of the quantum dot may be selected from a group II-VI compound, a group III-V compound, a group IV-VI compound, a group IV element, a group IV compound, and combination thereof.

The group II-VI compound may be selected from a group including a binary compound selected from a group consisting of CdSe, CdTe, ZnS, ZnSe, ZnTe, ZnO, HgS, HgSe, HgTe, MgSe, MgS, and a mixture thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from a group including a binary compound selected from a group consisting of GaN, GaP, GaAs, GaSb, AlN, AlP, AlAs, AlSb, InN, InP, InAs, InSb, and a mixture thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from a group including a binary compound selected from a group consisting of SnS, SnSe, SnTe, PbS, PbSe, PbTe, and a mixture thereof; a ternary compound selected from a group consisting of SnSeS, SnSeTe, SnSTe, PbSeS, PbSeTe, PbSTe, SnPbS, SnPbSe, SnPbTe, and a mixture thereof; and a quaternary compound selected from a group consisting of SnPbSSe, SnPbSeTe, SnPbSTe, and a mixture thereof. The group IV element may be selected from a group consisting of Si, Ge, and mixture thereof. The group IV compound may be a binary compound selected from a group consisting of SiC, SiGe, and mixture thereof.

A binary compound, a ternary compound, or a quaternary compound may be present in the particle at a uniform concentration or in the same particle of which a concentration distribution may be partially divided into different states. Also, they may have a core/shell structure in which one quantum dot surrounds another quantum dot. The interface between the core and the shell may have a concentration gradient in which the concentration of the elements present in the shell decreases toward the center.

In some exemplary embodiments, the quantum dots may have a core-shell structure including a core including the above-described nanocrystal and a shell surrounding the core. The shell of the quantum dot may act as a protective layer for maintaining the semiconductor characteristic by preventing a chemical modification of the core and/or a charging layer for imparting an electrophoretic characteristic to the quantum dot. The shell can be single-layered or multi-layered. The interface between the core and the shell may have a concentration gradient in which the concentration of elements present in the shell decreases toward the center. Examples of the shell of the quantum dot include a metal or non-metal oxide, a semiconductor compound, or a combination thereof.

For example, the metal or non-metal oxide may be exemplified as a binary compound such as $SiO_2$, $Al_2O_3$, Tizn, ZnO, MnO, $Mn_2O_3$, $Mn_3O_4$, CuO, FeO, $Fe_2O_3$, $Fe_3O_4$, CoO, $Co_3O_4$, or NiO, or $MgAl_2O_4$, or a ternary compound such as $CoFe_2O_4$, $NiFe_2O_4$, or $CoMn_2O_4$, but the present invention is not limited thereto.

Also, the semiconductor compound may be exemplified as CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, but the present invention is not limited thereto.

The quantum dot may have a full width of half maximum (FWHM) of about 45 nm or less, preferably about 40 nm or less, more preferably about 30 nm or less, and may improve color purity or color reproducibility in this range. Also, since light emitted through the quantum dots is emitted in all directions, a wide viewing angle may be improved.

In addition, the shape of the quantum dot is not particularly limited to that of a type commonly used in the art, but more specifically, may be spherical, pyramidal, multi-armed, or cubic nanoparticles, nanotubes, nanowire, nanofibers, nano-plate particles, and the like.

The quantum dot may control the color of light emitted according to the particle size, and accordingly, the quantum dot may have various emission colors such as blue, red, and green.

An insulating layer 440 may be disposed on the plurality of the color conversion layers 430a and 430b and the transmission layer 430c, and a plurality of color filters 450a, 450b and 450c and a light blocking member 460 may be disposed thereon.

The color filter 450a may represent the second color light, the color filter 450b may represent the third color light, and the color filter 450c may represent the first color light.

The light blocking member 460 may be disposed between the neighboring color filters 450a, 450b, and 450c.

A substrate 210 may be disposed on the plurality of color filters 450a, 450b, and 450c and the light blocking member 460. That is, a plurality of color conversion layers 430a and 430b and a plurality of color filters 450a, 450b and 450c may be disposed between the substrate 110 and the substrate 210.

According to another exemplary embodiment, instead of including a plurality of the color conversion layers 430a and 430b and the transmission layer 430c, the emission layer 370 may include quantum dots.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A display device comprising:
a substrate;
a first data line, a second data line, and a third data line extending in a first direction on the substrate and disposed to be adjacent to each other along a second direction crossing the first direction;
a semiconductor layer disposed on the first, second, and third data lines;
a first lower storage electrode, a second lower storage electrode, and a third lower storage electrode arranged to be adjacent along the first direction;
a first scan line extending in the second direction;
a first auxiliary scan pattern overlapping the first scan line and connected to the first scan line;
a first pixel connected to the first scan line and the first data line;
a second pixel connected to the first scan line and the second data line; and
a third pixel connected to the first scan line and the third data line,
wherein the first auxiliary scan pattern is disposed on a same layer as the first lower storage electrode and does not overlap the first, second, and third data lines.

2. The display device of claim 1, wherein the first auxiliary scan pattern is disposed on a same layer as the second lower storage electrode and the third lower storage electrode.

3. The display device of claim 1, further comprising:
a first upper storage electrode overlapping the first lower storage electrode;
a second upper storage electrode overlapping the second lower storage electrode; and
a third upper storage electrode overlapping the third lower storage electrode,
wherein the first upper storage electrode, the second upper storage electrode, and the third upper storage electrode are sequentially disposed along the first direction and disposed on a same layer as the first scan line.

4. The display device of claim 3, further comprising:
a first light blocking layer overlapping the first lower storage electrode;
a second light blocking layer overlapping the second lower storage electrode; and
a third light blocking layer overlapping the third lower storage electrode,
wherein the first light blocking layer, the second light blocking layer, and the third light blocking layer are sequentially disposed along the first direction and disposed on a same layer on the first, second, and third data lines.

5. The display device of claim 3, further comprising a driving voltage line and an initialization voltage line extending in the first direction, wherein:
the first pixel includes:
a first driving transistor connected between the driving voltage line and the first upper storage electrode;
a first switching transistor connected between the first lower storage electrode and the first data line; and
a first initialization transistor connected between the initialization voltage line and the first upper storage electrode;
the second pixel includes:
a second driving transistor connected between the driving voltage line and the second upper storage electrode;
a second switching transistor connected between the second lower storage electrode and the second data line; and
a second initialization transistor connected between the initialization voltage line and the second upper storage electrode; and
the third pixel includes:
a third driving transistor connected between the driving voltage line and the third upper storage electrode;
a third switching transistor connected between the third lower storage electrode and the third data line; and
a third initialization transistor connected between the initialization voltage line and the third upper storage electrode.

6. The display device of claim 5, wherein:
the first driving transistor, the second driving transistor, and the third driving transistor are disposed sequentially along the first direction;
the first switching transistor, the second switching transistor, and the third switching transistor are sequentially disposed along the first direction and connected to the first scan line; and
the first initialization transistor, the second initialization transistor, and the third initialization transistor are sequentially disposed along the first direction.

7. The display device of claim 5, further comprising a second scan line extending in the second direction,
wherein the second scan line is disposed on a same layer as the first scan line and connected to the first initialization transistor, the second initialization transistor, and the third initialization transistor.

8. The display device of claim 7, further comprising a second auxiliary scan pattern overlapping the second scan line and connected to the second scan line,
wherein the second auxiliary scan pattern is disposed on a same layer as the first lower storage electrode and does not overlap the first, second, and third data lines.

9. The display device of claim 5, further comprising:
a first insulating layer disposed on the semiconductor layer;
a second insulating layer disposed on the first, second, and third lower storage electrodes; and
a third insulating layer disposed on the first scan line,
wherein:
the first lower storage electrode, the second lower storage electrode, and the third lower storage electrode are disposed on the first insulating layer;
the first scan line is disposed on the second insulating layer;
the first pixel further includes a first pixel electrode disposed on the third insulating layer and connected to the first driving transistor; and
the first pixel electrode overlaps the second pixel or the third pixel.

10. The display device of claim 9, further comprising:
a common voltage line extending in the first direction and disposed on a same layer as the first data line;
a common voltage connection pattern connected to the common voltage line and disposed on a same layer as the first pixel electrode;
an emission layer disposed on the first pixel electrode; and
a common electrode disposed on the emission layer and connected to the common voltage connection pattern.

11. The display device of claim 10, further comprising an auxiliary common voltage line extending in the second direction, disposed on a same layer as the first scan line, and connected to the common voltage line.

12. The display device of claim 11, further comprising an auxiliary driving voltage line extending in the second direction, disposed on a same layer as the first scan line and connected to the driving voltage line.

13. The display device of claim 10, further comprising an auxiliary common voltage line extending from the common voltage connection pattern and disposed on a same layer as the first pixel electrode.

14. The display device of claim 9, wherein:
the second pixel further includes a second pixel electrode connected to the second driving transistor;
the third pixel further includes a third pixel electrode connected to the third driving transistor; and
the data line overlaps one of the first pixel electrode, the second pixel electrode, and the third pixel electrode and does not overlap the rest.

15. The display device of claim 9, further comprising a connection electrode connecting the first data line and the first switching transistor,
wherein the connection electrode is disposed on a same layer as the first scan line.

16. The display device of claim 15, wherein:
the second insulating layer includes a single opening overlapping the connection electrode, the first data line, and the first switching transistor;

the connection electrode is connected to the first data line and the first switching transistor through the opening; and the connection electrode contacts a side surface of the first switching transistor in the opening.

17. A display device comprising:

a substrate;

a common voltage line, a driving voltage line, and a data line extending in a first direction on the substrate and disposed on a same layer;

a first common voltage auxiliary pattern overlapping the common voltage line;

a first insulating layer disposed between the common voltage line and the first common voltage auxiliary pattern;

a second common voltage auxiliary pattern overlapping the common voltage line and the first common voltage auxiliary pattern and connected to the common voltage line and the first common voltage auxiliary pattern;

a second insulating layer disposed between the first common voltage auxiliary pattern and the second common voltage auxiliary pattern;

a first scan line extending in a second direction crossing the first direction and disposed on the second insulating layer;

is a pixel connected to the driving voltage line, the data line, and the first scan line through at least one transistor; and an auxiliary common voltage line extending in the second direction and connected to the common voltage line, wherein the auxiliary common voltage line is disposed on a same layer as the second common voltage auxiliary pattern and the first scan line.

18. The display device of claim 17, further comprising an auxiliary driving voltage line extending in the second direction, disposed on a same layer as the first scan line, and connected to the driving voltage line.

19. The display device of claim 18, further comprising:

a common voltage connection pattern connected to the common voltage line;

a third insulating layer disposed between the second common voltage auxiliary pattern and the common voltage connection pattern;

a common electrode connected to the second common voltage auxiliary pattern; and a fourth insulating layer disposed between the common voltage connection pattern and the common electrode.

20. The display device of claim 19, wherein the auxiliary common voltage line extends from the common voltage connection pattern and is disposed on a same layer as the common voltage connection pattern.

* * * * *